(12) United States Patent
Albessard et al.

(10) Patent No.: US 8,974,697 B2
(45) Date of Patent: Mar. 10, 2015

(54) LUMINESCENT MATERIAL

(75) Inventors: Keiko Albessard, Yokohama (JP); Masahiro Kato, Naka-gun (JP); Yumi Fukuda, Tokyo (JP); Iwao Mitsuishi, Machida (JP); Takahiro Sato, Kawasaki (JP); Shigeya Kimura, Yokohama (JP); Aoi Okada, Kawasaki (JP); Naotoshi Matsuda, Chigasaki (JP); Ryosuke Hiramatsu, Yokohama (JP); Yasushi Hattori, Kawasaki (JP); Kunio Ishida, Fuchu (JP); Hironori Asai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 13/601,070

(22) Filed: Aug. 31, 2012

(65) Prior Publication Data

US 2013/0234585 A1 Sep. 12, 2013

(30) Foreign Application Priority Data

Dec. 7, 2011 (JP) .................................. 2011-268212

(51) Int. Cl.
- *C09K 11/59* (2006.01)
- *C09K 11/77* (2006.01)
- *H05B 33/12* (2006.01)
- *H01L 33/50* (2010.01)

(52) U.S. Cl.
CPC ............ *C09K 11/7734* (2013.01); *H05B 33/12* (2013.01); *H01L 33/502* (2013.01); *H01L 33/504* (2013.01)
USPC ....................... 252/301.4 F; 313/503; 257/98

(58) Field of Classification Search
USPC ....................... 252/301.4 F; 313/503; 257/98
See application file for complete search history.

(56) References Cited

U.S. PATENT DOCUMENTS

| | | | |
|---|---|---|---|
| 2009/0096361 A1 | 4/2009 | Fukuda et al. | |
| 2010/0056216 A1* | 3/2010 | Li et al. ...................... | 455/562.1 |
| 2010/0102707 A1 | 4/2010 | Fukuda et al. | |
| 2011/0057149 A1 | 3/2011 | Fukuda et al. | |
| 2011/0058582 A1 | 3/2011 | Fukuda et al. | |
| 2011/0058583 A1 | 3/2011 | Fukuda et al. | |
| 2012/0056209 A1* | 3/2012 | Mitsuishi et al. ................ | 257/88 |
| 2012/0056225 A1* | 3/2012 | Mitsuishi et al. ................ | 257/98 |
| 2012/0062103 A1 | 3/2012 | Okada et al. | |

FOREIGN PATENT DOCUMENTS

| | | |
|---|---|---|
| JP | 2004-115633 | 4/2004 |
| JP | 2008-278642 A | 11/2008 |
| JP | 2010-106127 | 5/2010 |

OTHER PUBLICATIONS

U.S. Appl. No. 14/193,305, filed Feb. 28, 2014, Albessard, et al.
U.S. Appl. No. 14/134,293, filed Dec. 19, 2013, Matsuda, et al.
First Office Action issued Jan. 6, 2015, in corresponding Japanese Patent Application No. 2011-268212, drafted Dec. 26, 2014, (with English-language Translation).

* cited by examiner

*Primary Examiner* — Carol M Koslow
(74) *Attorney, Agent, or Firm* — Oblon, McClelland, Maier & Neustadt, L.L.P.

(57) ABSTRACT

According to one embodiment, the luminescent material shows a luminescence peak in a wavelength range of 570 to 670 nm when excited with light having an emission peak in a wavelength range of 250 to 520 nm. The luminescent material includes a host material having a crystal structure substantially same as the crystal structure of $Sr_2Si_7Al_3ON_{13}$. The host material is activated by Eu, and includes Sr and Ca to satisfy a relationship of $0.008 \leq M_{Ca}/(M_{Sr}+M_{Ca}) \leq 0.114$, where $M_{Ca}$ is a number of moles of Ca and $M_{Sr}$ is a number of moles of Sr.

14 Claims, 22 Drawing Sheets

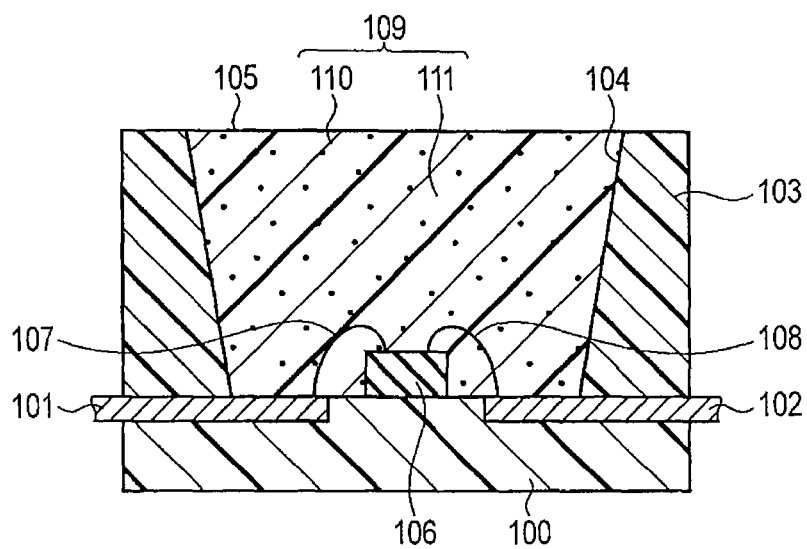
F I G. 4
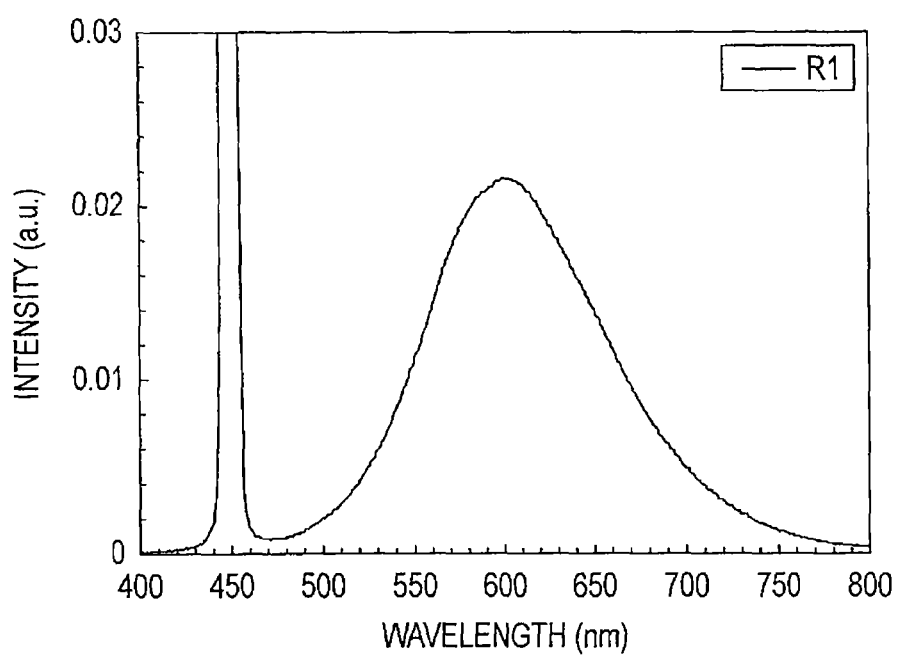
F I G. 5

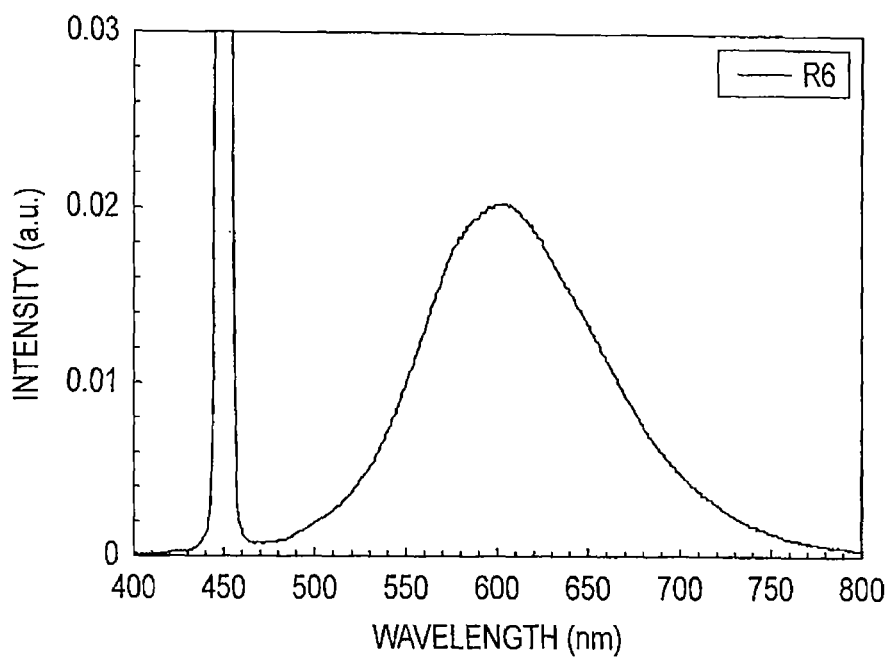
F I G. 10
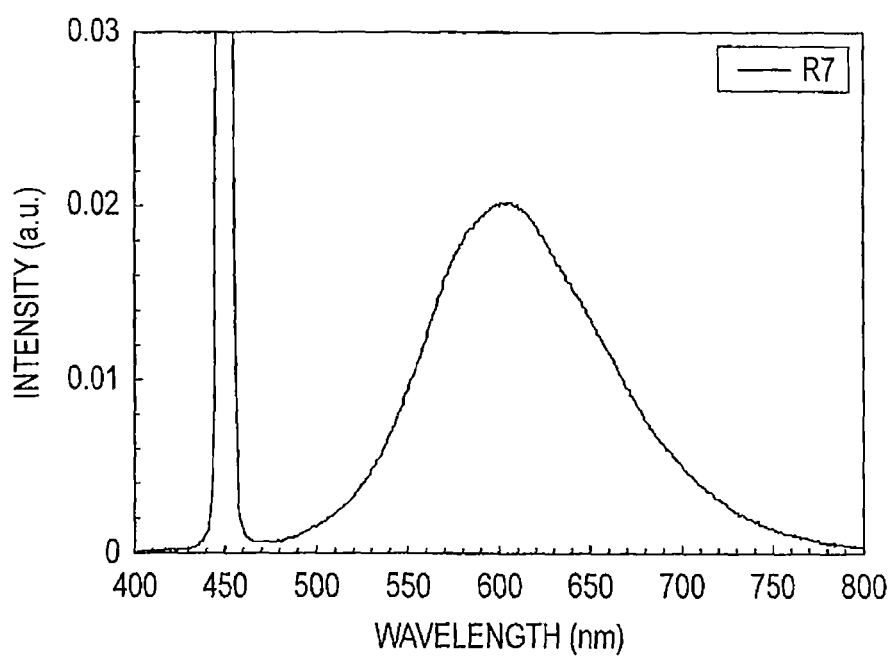
F I G. 11

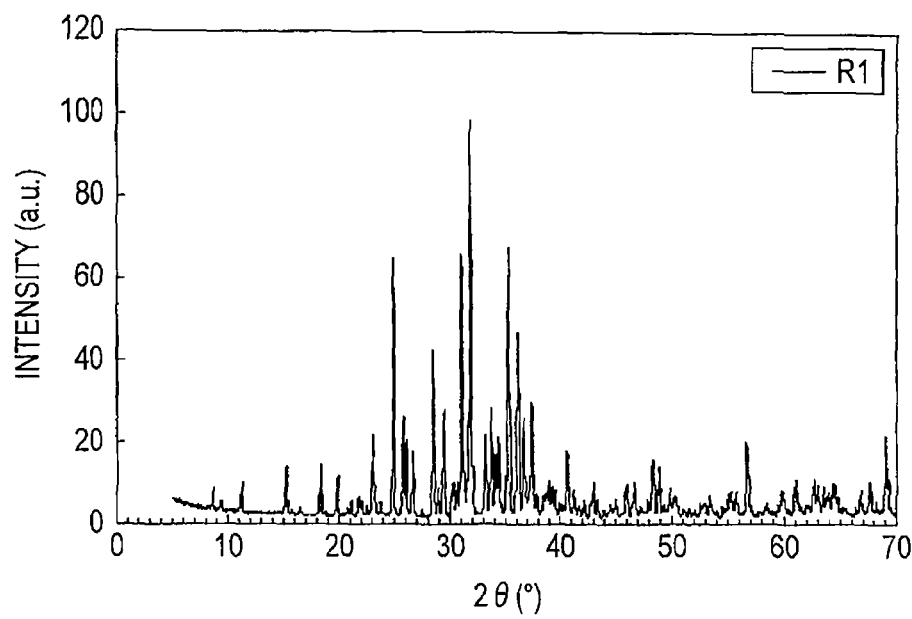
F I G. 14
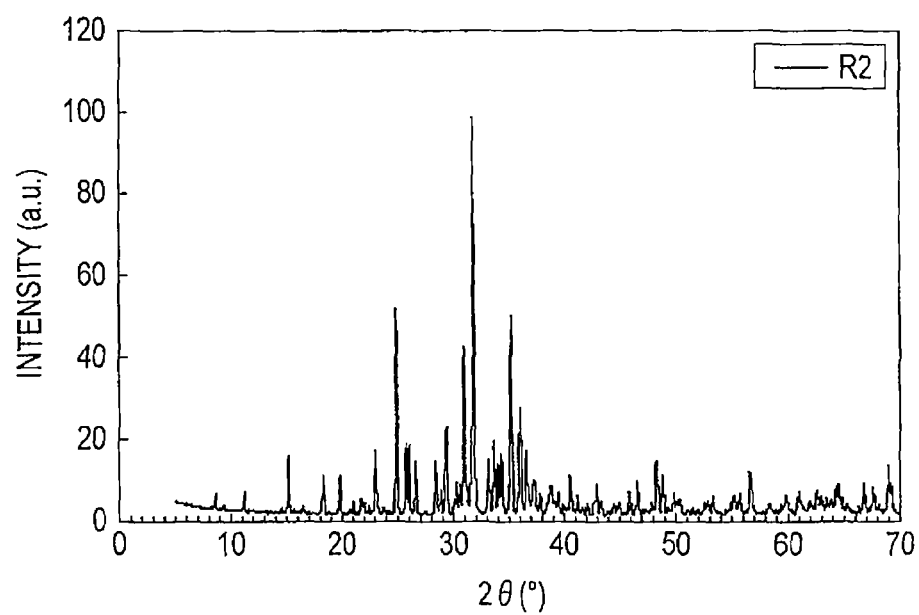
F I G. 15

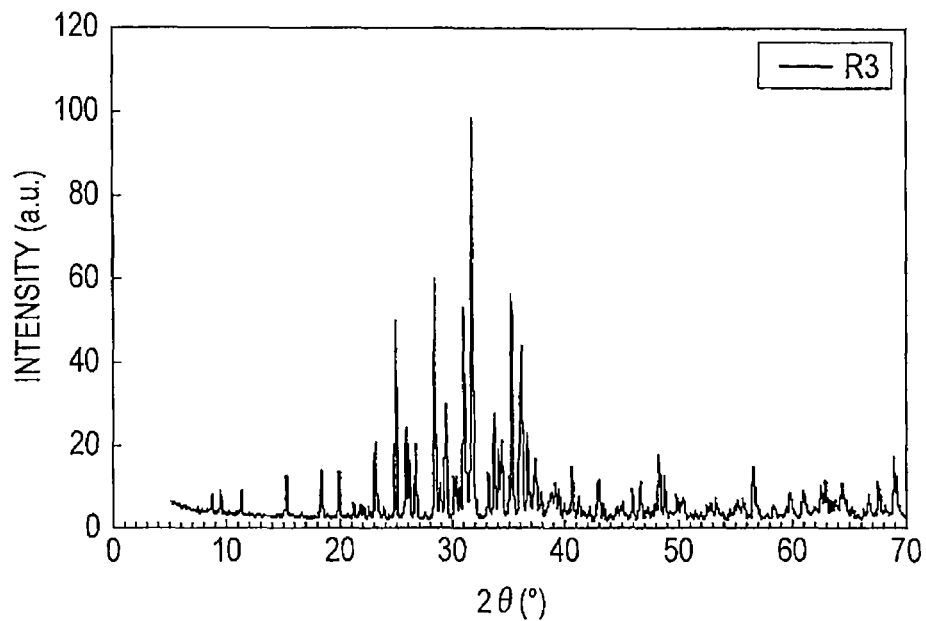
F I G. 16
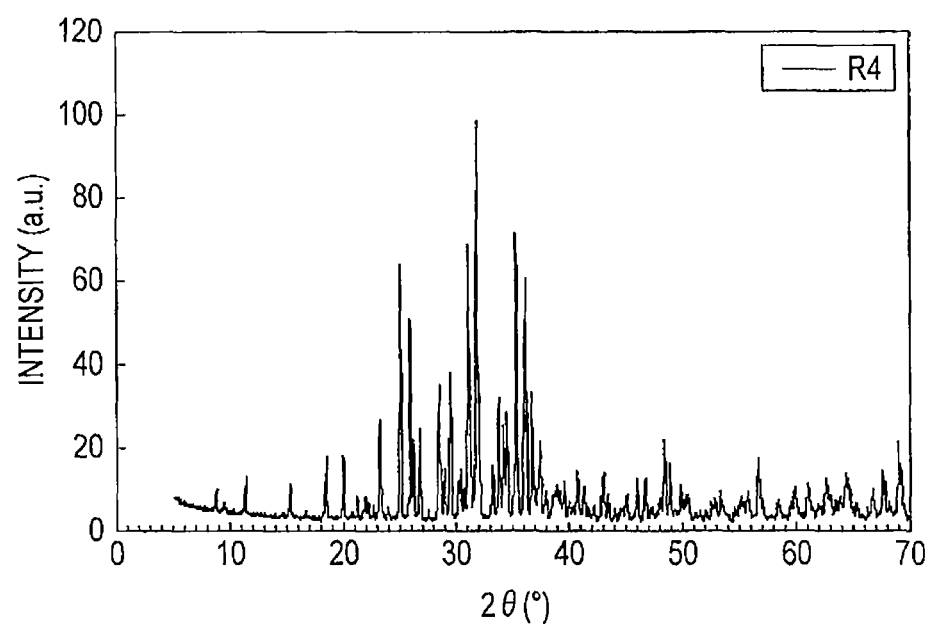
F I G. 17

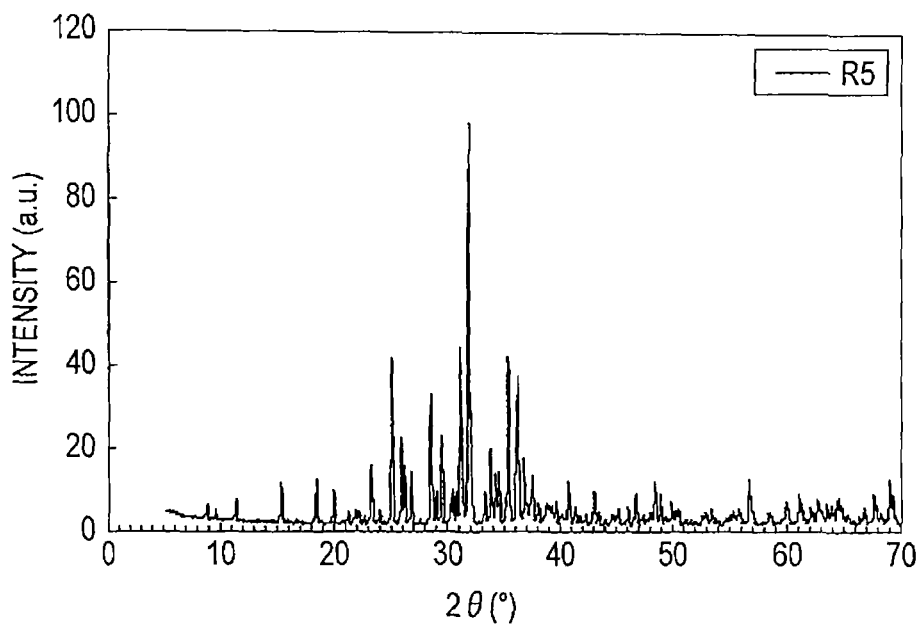
F I G. 18
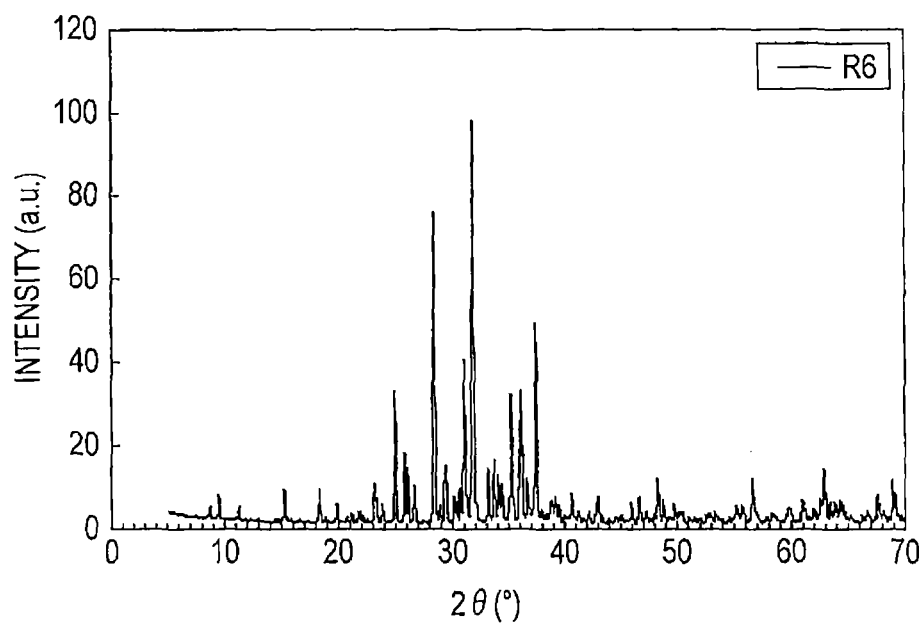
F I G. 19

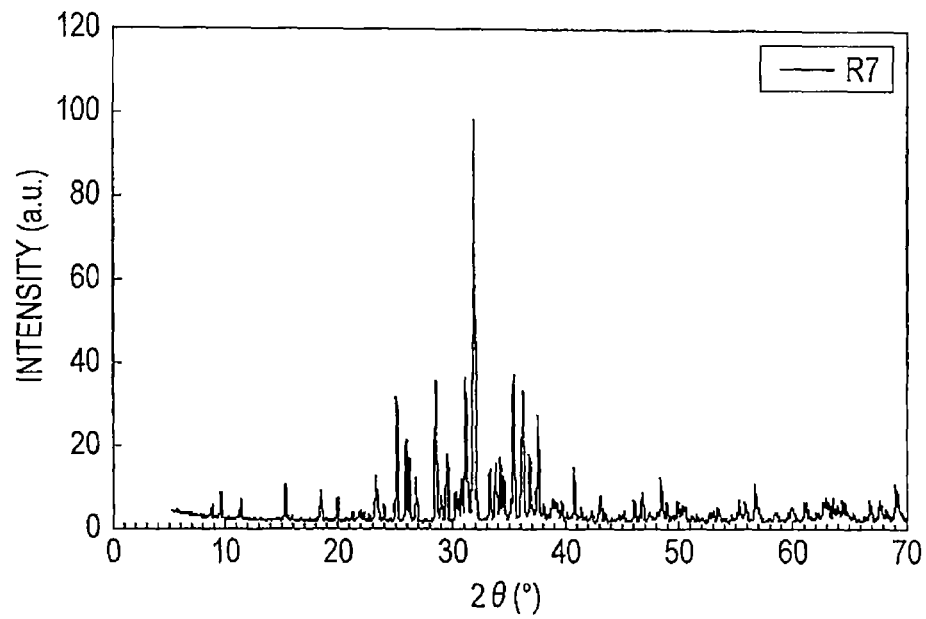
F I G. 20
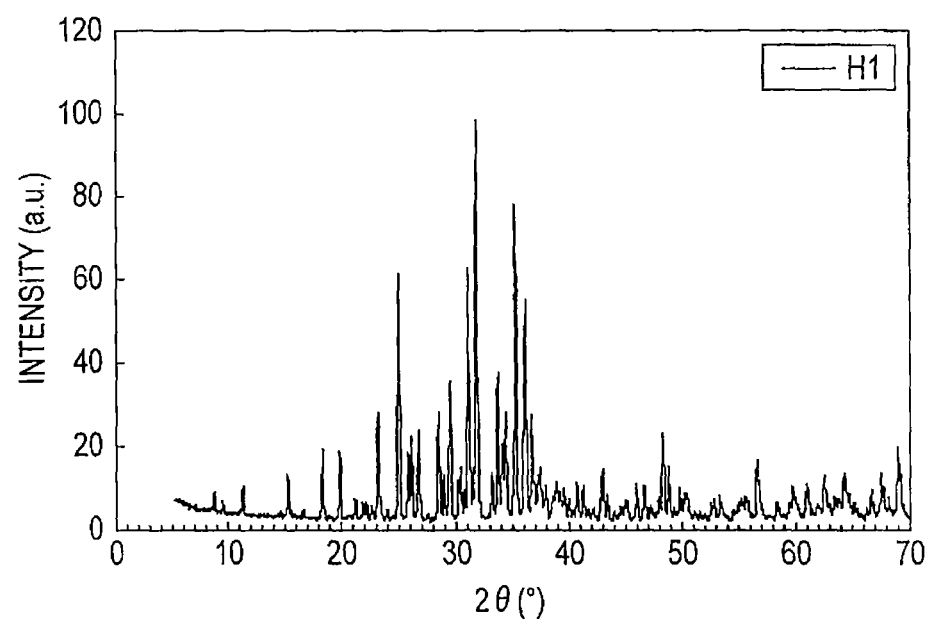
F I G. 21

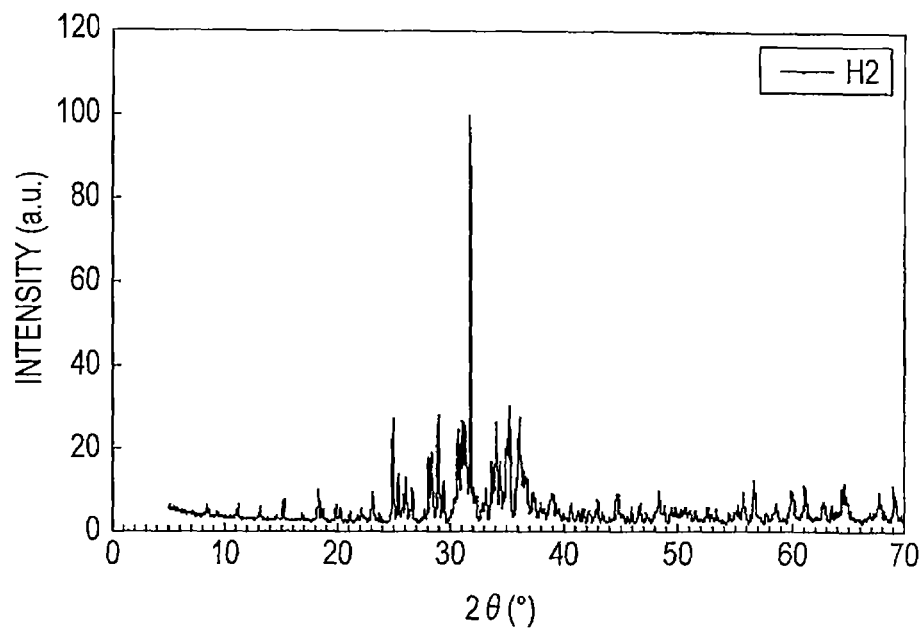
F I G. 22
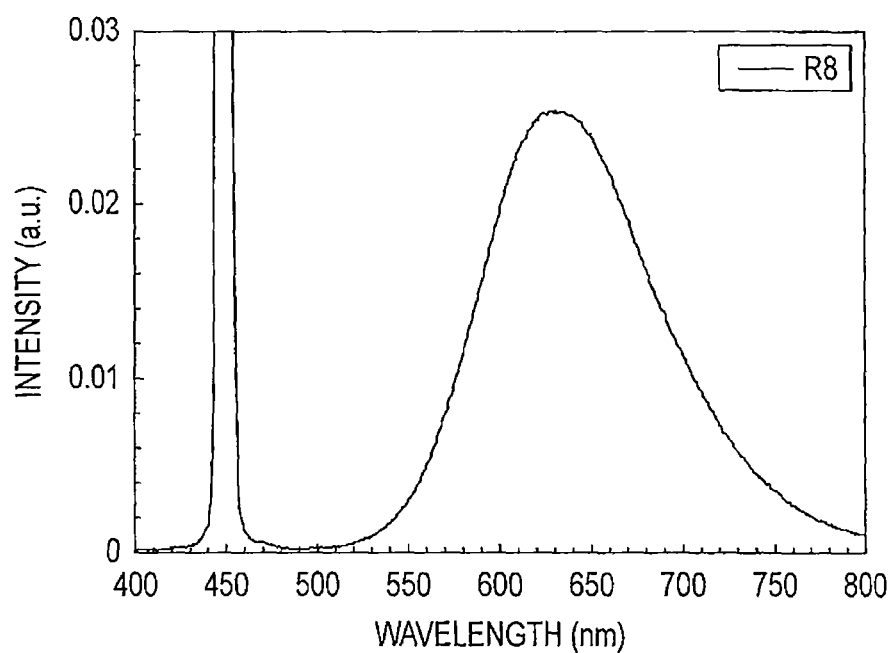
F I G. 23

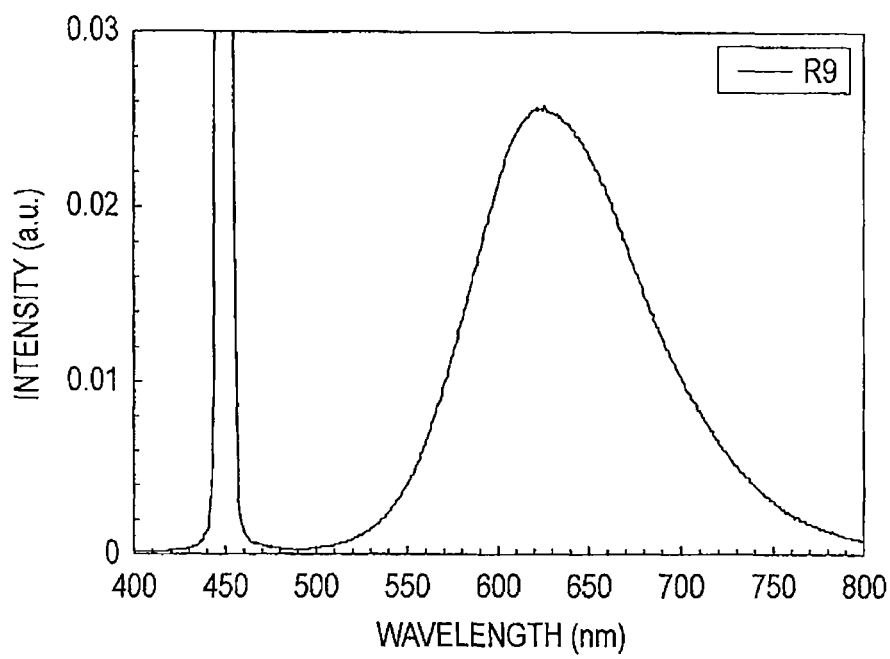
F I G. 24
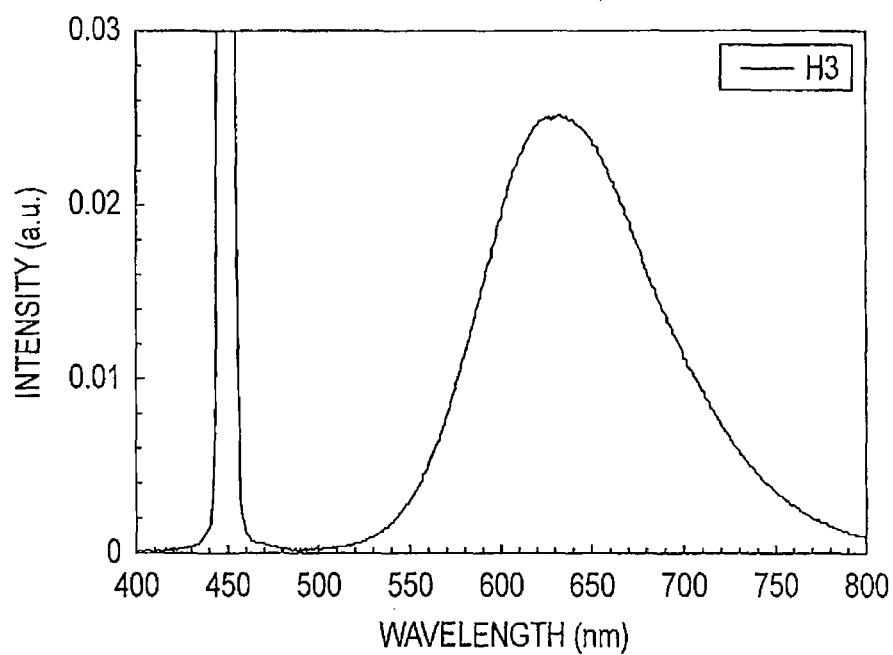
F I G. 25

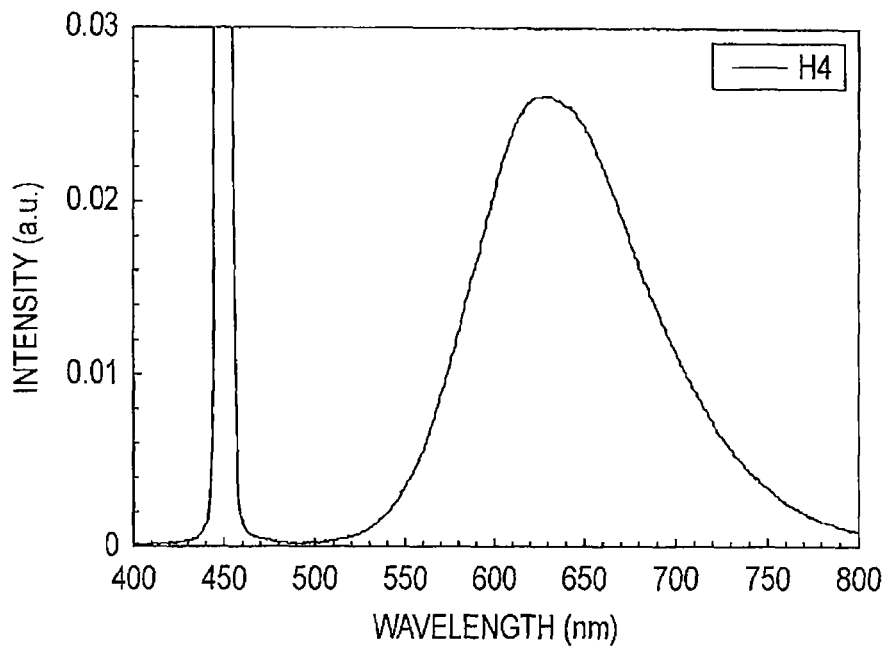
F I G. 26
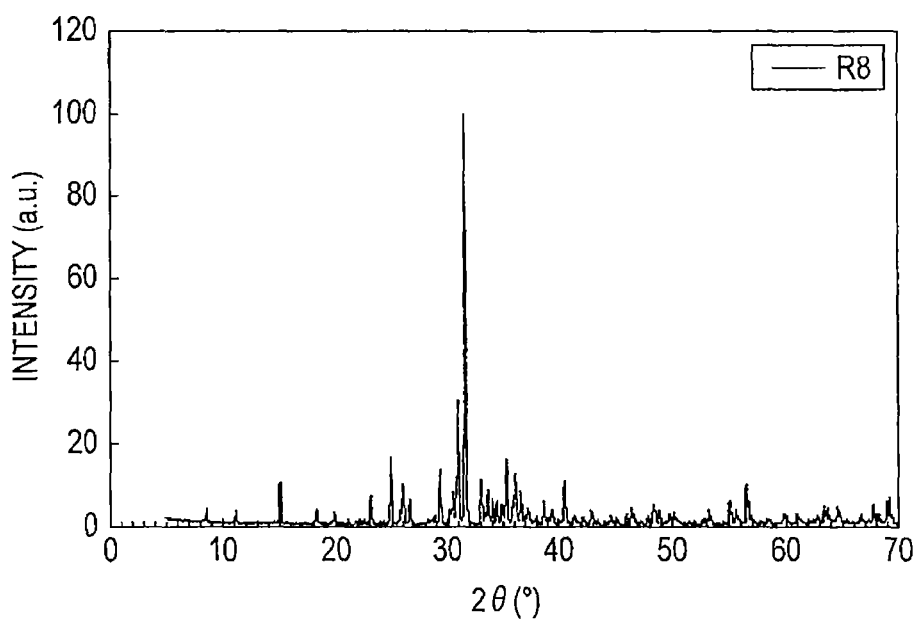
F I G. 27

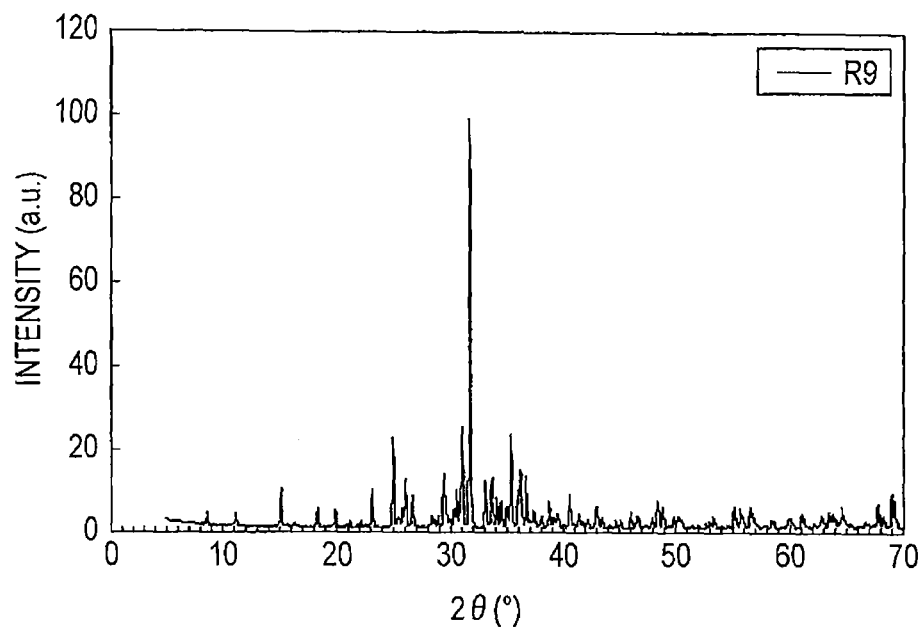
F I G. 28
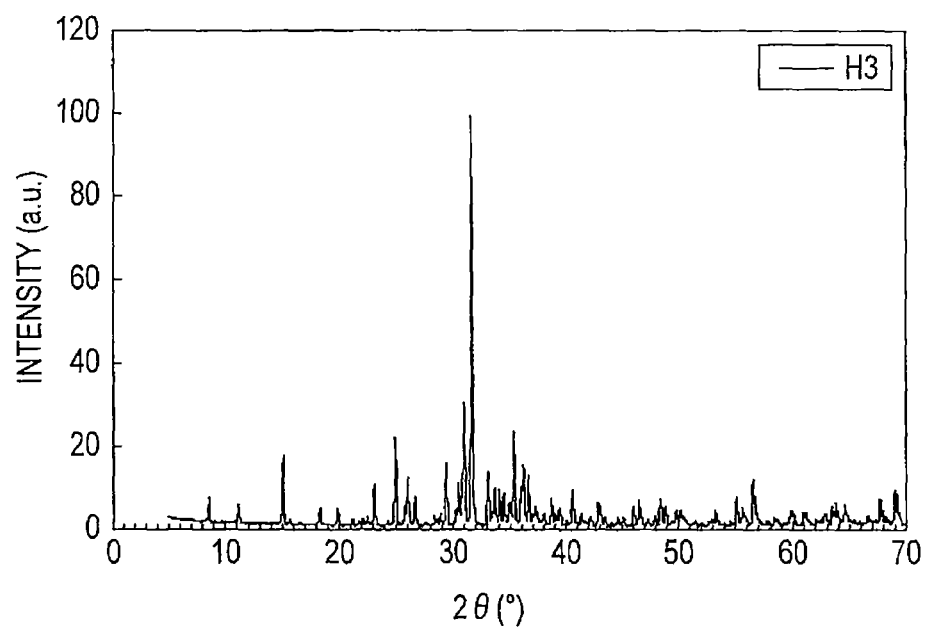
F I G. 29

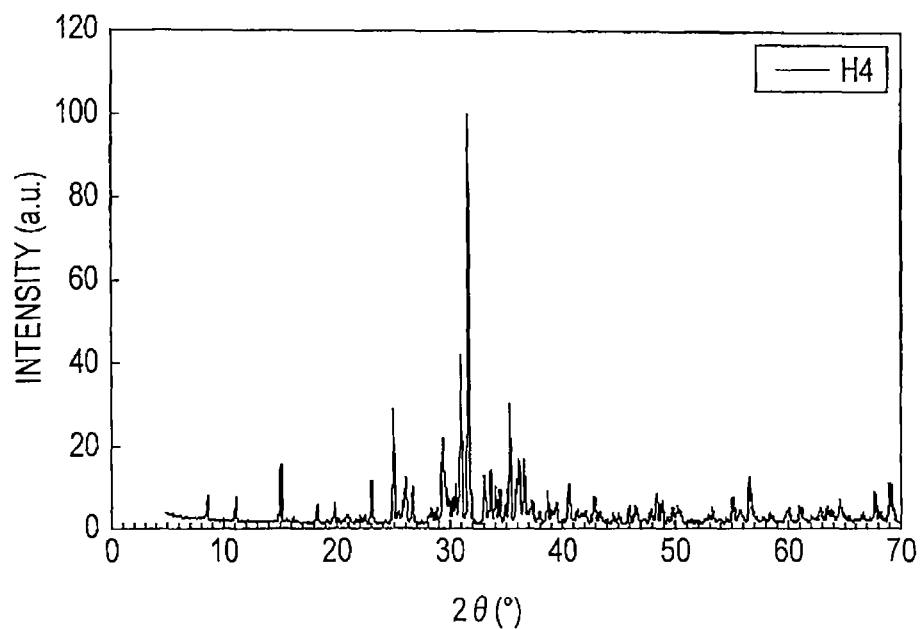
F I G. 30
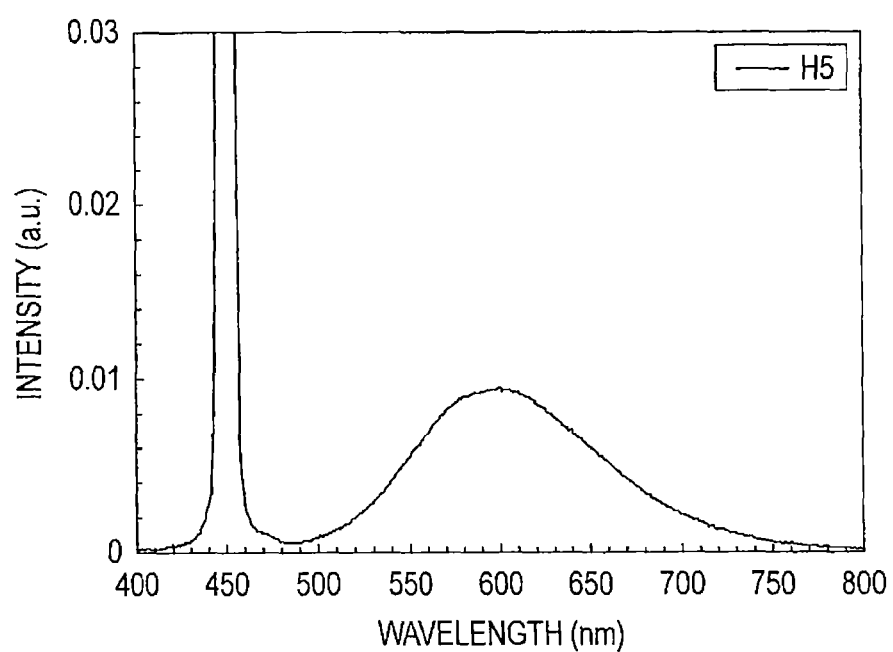
F I G. 31

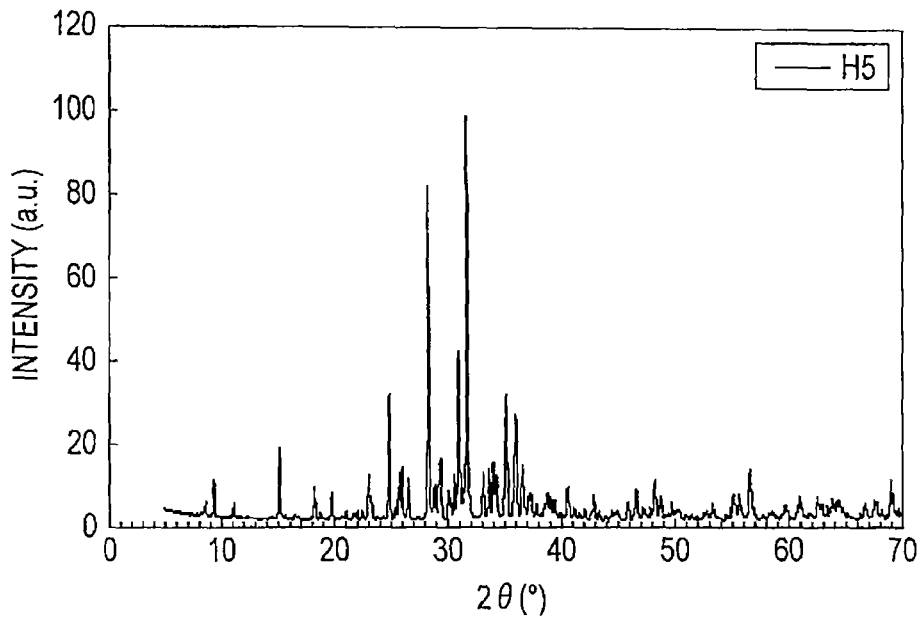
F I G. 32
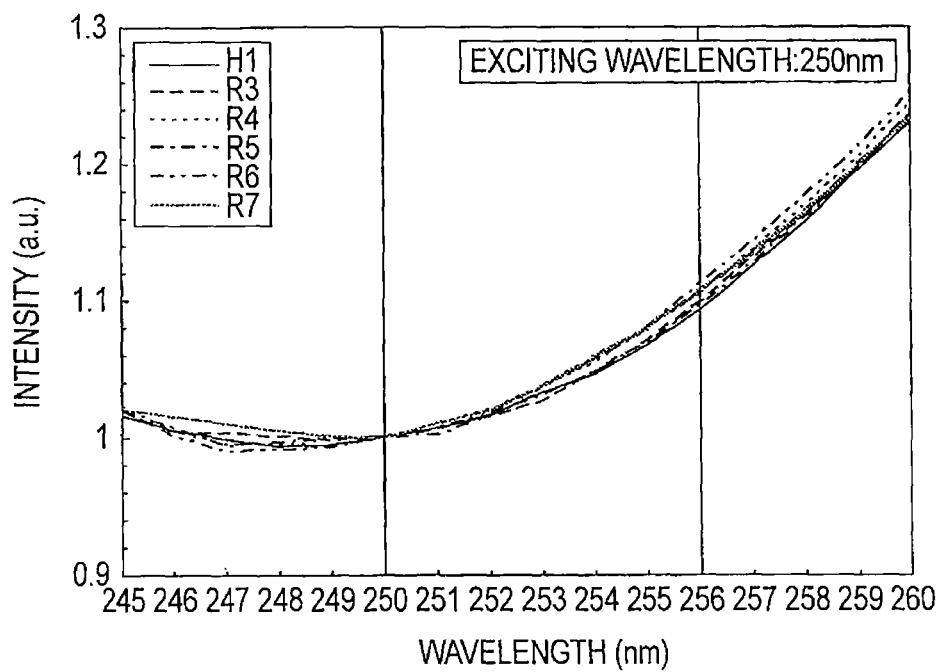
F I G. 33

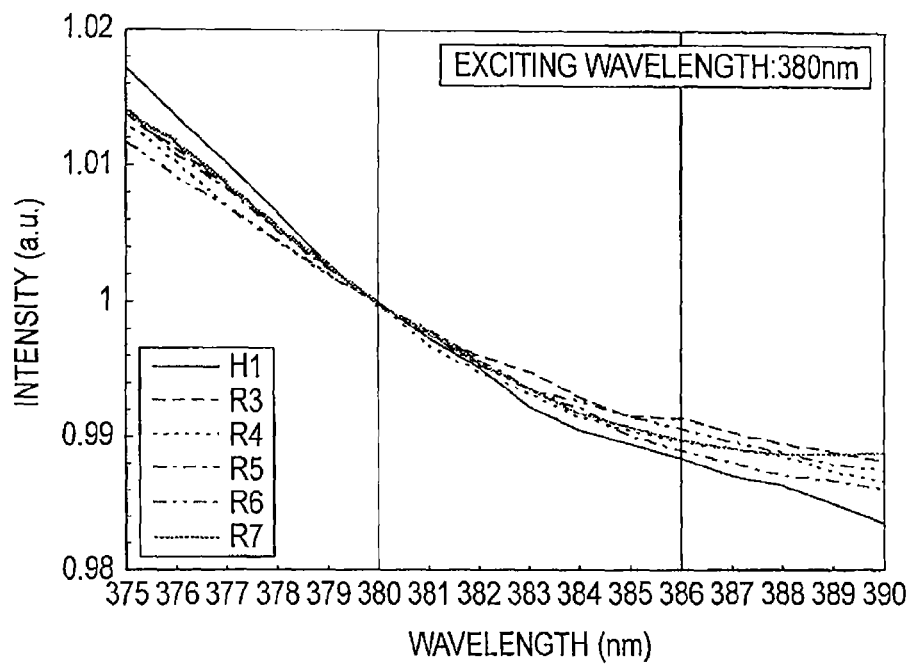
F I G. 36
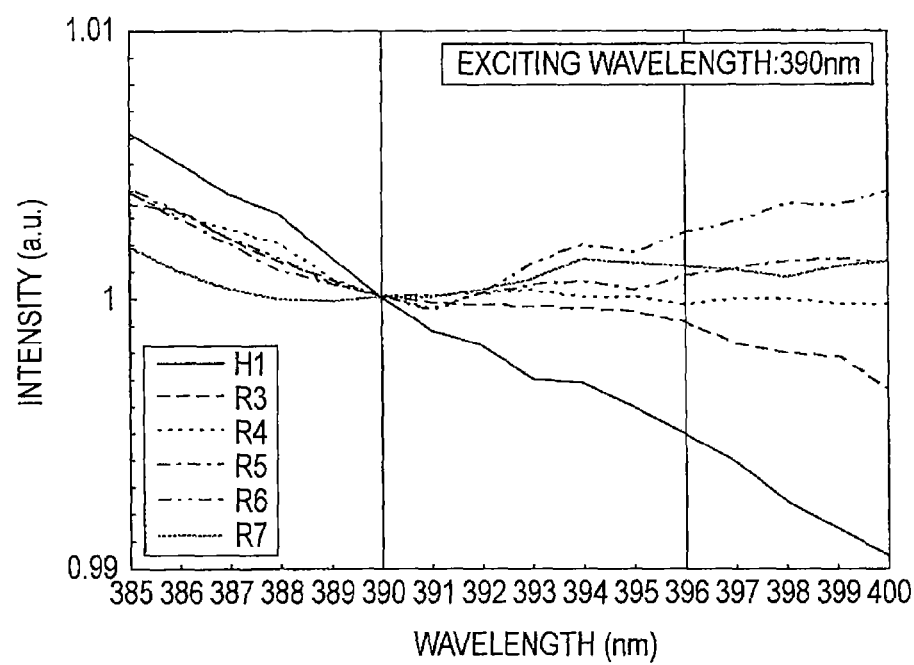
F I G. 37

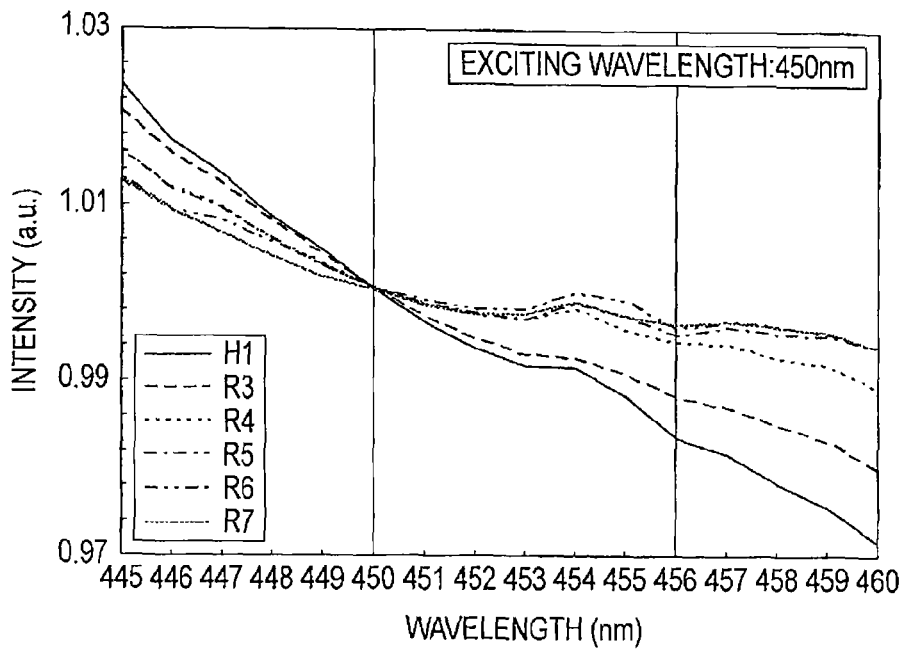
F I G. 40
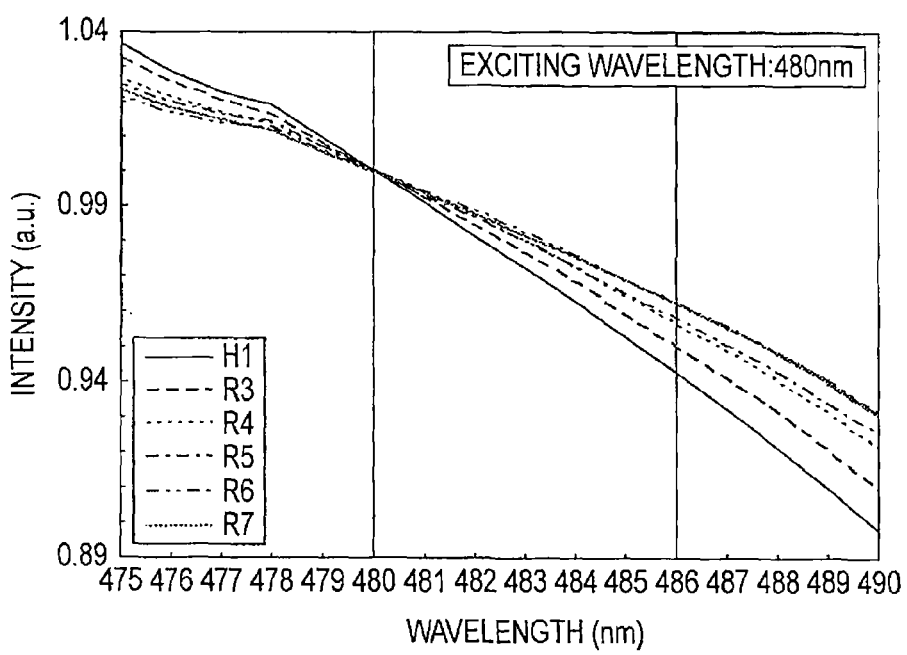
F I G. 41

US 8,974,697 B2

LUMINESCENT MATERIAL

CROSS-REFERENCE TO RELATED APPLICATIONS

This application is based upon and claims the benefit of priority from Japanese Patent Application No. 2011-268212, filed Dec. 7, 2011, the entire contents of which are incorporated herein by reference.

FIELD

Embodiments described herein relate generally to a luminescent material and a light-emitting device using the same.

BACKGROUND

A white light-emitting device is formed by combining, for example, a luminescent material that emits red light by excitation with blue light, a luminescent material that emits green light by excitation with blue light, and a blue LED. For driving of a high-output blue LED, normally a high current of 350 mA or more is introduced, and this driving thus causes the LED to generate heat (for example 135° C. or more). The luminous intensity of a luminescent material generally decreases as the temperature rises (temperature quenching).

By temperature rising, the wavelength of light emitted from a blue LED shifts toward the long wavelength side (for example about 6 nm at 150° C.). If the excitation spectrum of a luminescent material decreases in a wavelength range after the shift, a decrease in luminous intensity becomes noticeable, and it is therefore desired that a decrease in the excitation spectrum of the luminescent material at around a wavelength of light emitted by the LED should be low.

There is a difference in the degree of temperature quenching between a red-emitting luminescent material and a green-emitting luminescent material, and if the temperature of a blue LED rises in a white light-emitting device, the balance between the red and the green is easily broken. As a result, the balance between a red luminescence and a green luminescence from luminescent materials and a blue luminescence from a light source is broken.

A luminescent material having a low decrease in luminous intensity by temperature rising is also desired for avoiding a noticeable "color shift" in a white light-emitting device.

BRIEF DESCRIPTION OF THE DRAWINGS

FIG. 4 is a schematic view showing a configuration of a light-emitting device according to one embodiment;

FIG. 5 is a luminescence emission spectrum when a luminescent material of Example is excited with light having a peak wavelength of 450 nm;

FIG. 10 is a luminescence emission spectrum when a luminescent material of Example is excited with light having a peak wavelength of 450 nm;

FIG. 11 is a luminescence emission spectrum when a luminescent material of Example is excited with light having a peak wavelength of 450 nm;

FIG. 14 is an XRD pattern of a luminescent material of Example;

FIG. 15 is an XRD pattern of a luminescent material of Example;

FIG. 16 is an XRD pattern of a luminescent material of Example;

FIG. 17 is an XRD pattern of a luminescent material of Example;

FIG. 18 is an XRD pattern of a luminescent material of Example;

FIG. 19 is an XRD pattern of a luminescent material of Example;

FIG. 20 is an XRD pattern of a luminescent material of Example;

FIG. 21 is an XRD pattern of a luminescent material of Example;

FIG. 22 is an XRD pattern of a luminescent material of Example;

FIG. 23 is a luminescence emission spectrum when a luminescent material of Example is excited with light having a peak wavelength of 450 nm;

FIG. 24 is a luminescence emission spectrum when a luminescent material of Example is excited with light having a peak wavelength of 450 nm;

FIG. 25 is a luminescence emission spectrum when a luminescent material of Comparative Example is excited with light having a peak wavelength of 450 nm;

FIG. 26 is a luminescence emission spectrum when a luminescent material of Comparative Example is excited with light having a peak wavelength of 450 nm;

FIG. 27 is an XRD pattern of a luminescent material of Example;

FIG. 28 is an XRD pattern of a luminescent material of Example;

FIG. 29 is an XRD pattern of a luminescent material of Comparative Example;

FIG. 30 is an XRD pattern of a luminescent material of Comparative Example;

FIG. 31 is an emission spectrum when a luminescent material of Comparative Example is excited with light having a peak wavelength of 450 nm;

FIG. 32 is an XRD pattern of a luminescent material of Comparative Example;

FIG. 33 is normalized excitation spectra of luminescent materials of Example and Comparative Example;

FIG. 36 is normalized excitation spectra of luminescent materials of Example and Comparative Example;

FIG. 37 is normalized excitation spectra of luminescent materials of Example and Comparative Example;

FIG. 40 is normalized excitation spectra of luminescent materials of Example and Comparative Example;

FIG. 41 is normalized excitation spectra of luminescent materials of Example and Comparative Example;

DETAILED DESCRIPTION

Figure 1A:
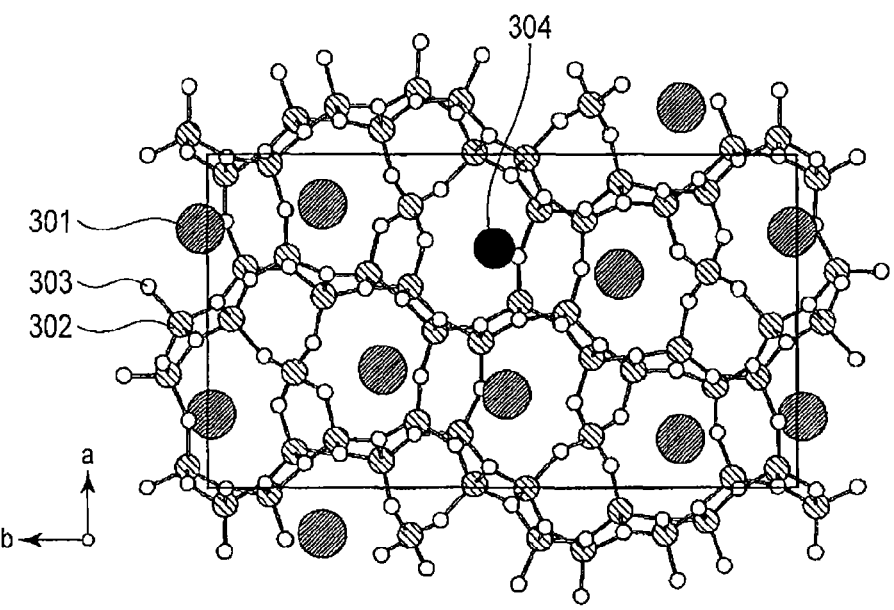
FIGS. 1A, 1B and 1C each show a crystal structure of $Sr_2Si_7Al_3ON_{13}$.

Embodiments will be described specifically hereinbelow.

In general, according to one embodiment, a luminescent material exhibits a luminescence spectrum having a peak in a wavelength range of 570 to 670 nm when excited with light having an emission peak in a wavelength range of 250 to 520 nm, and is therefore a red-emitting luminescent material. Such a luminescent material includes a host material having a crystal structure substantially same as the crystal structure of $Sr_2Si_7Al_3ON_{13}$, the host material is activated by Eu, and a predetermined amount of Ca is contained in the crystal structure of the host material activated by Eu. Specifically, Sr and Ca are contained in the crystal structure of the host material so as to satisfy a quantitative relationship represented by the formula:

$$0.008 \leq M_{Ca}/(M_{Sr}+M_{Ca}) \leq 0.114$$

wherein $M_{Ca}$ is the number of moles of Ca and $M_{Sr}$ is the number of moles of Sr.

The present inventors have found that a red-emitting luminescent material having a high quantum efficiency and a good temperature property is obtained by including Sr and Ca so as to satisfy a predetermined quantitative relationship in a Eu-activated luminescent material having a crystal structure substantially same as the crystal structure of $Sr_2Si_7Al_3ON_{13}$. The luminescent material of this embodiment can be obtained by, for example, replacing a predetermined amount of Sr by Ca in a luminescent material which has as a host material an inorganic compound having a crystal structure substantially same as the crystal structure of $Sr_2Si_7Al_3ON_{13}$ and contains Eu as a luminescence center.

The red-emitting luminescent material according to this embodiment has a low decrease in luminous intensity even when the temperature rises. A light-emitting device obtained by combining such a luminescent material with a LED can achieve an intended luminescence color even at driving under a high load where a high current of about several hundreds mA or more is introduced, and a color shift can be reduced.

The intensity of the excitation spectrum of a Eu-activated luminescent material having a crystal structure substantially same as the crystal structure of $Sr_2Si_7Al_3ON_{13}$ gradually decreases in a blue wavelength region (for example about 430 to 550 nm). On the other hand, a LED used for exciting a Eu-activated luminescent material having a crystal structure substantially same as the crystal structure of $Sr_2Si_7Al_3ON_{13}$ generates heat by high-load driving, so that the peak wavelength of its luminescence is extended.

If the wavelength of an excitation spectrum edge of a luminescent material is also extended, a decrease in intensity of the excitation spectrum is suppressed in a region where the peak wavelength of light emitted from a LED shifts toward the long wavelength side. The present inventors have made it possible to extend the wavelength of an excitation spectrum edge by including Sr and Ca in a predetermined amount in a Eu-activated luminescent material having a crystal structure substantially same as the crystal structure of $Sr_2Si_7Al_3ON_{13}$.

Since $Ca^{2+}$ has an ion radius smaller than that of $Sr^{2+}$, the crystal lattice is reduced if, for example, a part of Sr is replaced by Ca in a Eu-activated luminescent material having a crystal structure substantially same as the crystal structure of $Sr_2Si_7Al_3ON_{13}$. As a result, crystal field splitting of $Eu^{2+}$ becomes significant, so that the wavelength of an excitation spectrum edge is extended. Even though the temperature rises and the peak wavelength of a luminescence of a LED is extended, a decrease in luminous intensity can be suppressed as long as the wavelength of an excitation spectrum edge of a luminescent material excited with light emitted from the LED is extended.

It is known that like $Ca^{2+}$, $Mg^{2+}$ has an ion radius smaller than that of $Sr^{2+}$. However, replacement by Mg of a part of Sr of a Eu-activated luminescent material having a crystal structure substantially same as the crystal structure of $Sr_2Si_7Al_3ON_{13}$ is not as effective as replacement thereof by Ca. The ion radius of $Mg^{2+}$ is different from the ion radius of $Sr^{2+}$ so significantly that influences such as deterioration of crystallinity are conceivable although a crystal structure can be retained when a part of Sr is replaced by Mg. If a crystal structure cannot be retained, a heterophase is generated. As a result, the luminescence property is degraded, and therefore an intended effect cannot be obtained.

If Ca accounts for 0.8 mol % of the total amount of (Sr+Ca), an effect of reducing the crystal lattice is obtained. The amount of Ca is preferably 2.5 mol % or more of the total amount of (Sr+Ca). However, if the amount of Ca is more than 11.4 mol % of the total amount of (Sr+Ca), a heterophase is generated and the luminescence property is considerably degraded. Thus, the amount of Ca is specified to 0.8 mol % to 11.4 mol % inclusive of the total amount of (Sr+Ca). The following relationship holds between the number of moles of Sr ($M_{Sr}$) and the number of moles of Ca ($M_{Ca}$).

$$0.008 \leq M_{Ca}/(M_{Sr}+M_{Ca}) \leq 0.114$$

If Sr and Ca are contained so as to satisfy a predetermined quantitative relationship, a luminescence property comparable to that with no Ca contained is obtained. Specifically, the peak wavelength, luminous efficiency and temperature property of a luminescent material containing Sr and Ca so as to satisfy a predetermined quantitative relationship are in no way inferior as compared to a luminescent material containing no Ca.

The red-emitting luminescent material of this embodiment is a compound that is based on $(Sr.Ca.Eu)_2Si_7Al_3ON_{13}$. The dissolved amount of constituent element Sr, Ca, Eu, Si, Al, O or N may be deviated from a described value (the number of moles). The atomic distance may slightly change due to a difference in the dissolved amount, but the atom position hardly changes so significantly that chemical bonds between backbone atoms are broken. The atom position is given by a crystal structure, a site occupied by the atom and coordinates thereof.

The lattice constant of $Sr_2Si_7Al_3ON_{13}$ is a=11.8033 (13) Å, b=21.589 (2) Å, c=5.0131 (6) Å. The length of chemical bond (Sr—N and Sr—O) in $Sr_2Si_7Al_3ON_{13}$ can be calculated from the atomic coordinates shown in Table 1 below.

TABLE 1

| Site | Occupancy rate | x | y | z |
|---|---|---|---|---|
| Sr1 | 4a | 1 | 0.2786 | 0.49060(11) | 0.5284(14) |
| Sr2 | 4a | 1 | 0.3552(3) | 0.69839(12) | 0.048(2) |
| Si/Al1 | 4a | 1 | 0.3582(9) | 0.2769(3) | 0.070(3) |
| Si/Al2 | 4a | 1 | 0.5782(9) | 0.7996(4) | 0.047(5) |
| Si/Al3 | 4a | 1 | 0.5563(8) | 0.4672(3) | 0.543(5) |
| Si/Al4 | 4a | 1 | 0.4724(8) | 0.6092(3) | 0.556(4) |
| Si/Al5 | 4a | 1 | 0.1910(7) | 0.6397(3) | 0.535(4) |
| Si/Al6 | 4a | 1 | 0.0061(8) | 0.5438(3) | 0.546(4) |
| Si/Al7 | 4a | 1 | 0.1625(9) | 0.5661(3) | 0.038(4) |
| Si/Al8 | 4a | 1 | 0.3937(8) | 0.3469(3) | 0.547(4) |
| Si/Al9 | 4a | 1 | 0.1552(18) | 0.3483(8) | 0.318(3) |
| Si/Al10 | 4a | 1 | 0.1525(14) | 0.3492(6) | 0.813(2) |
| O/N1 | 4a | 1 | 0.436(2) | 0.8164(10) | 0.061(11) |
| O/N2 | 4a | 1 | 0.699(2) | 0.4692(10) | 0.513(10) |
| O/N3 | 4a | 1 | 0.334(2) | 0.6355(10) | 0.511(9) |
| O/N4 | 4a | 1 | 0.213(2) | 0.2980(11) | 0.056(12) |
| O/N5 | 4a | 1 | 0.256(2) | 0.3750(10) | 0.563(9) |
| O/N6 | 4a | 1 | 0.894(2) | 0.6002(12) | 0.549(14) |
| O/N7 | 4a | 1 | 0.358(3) | 0.2062(12) | 0.893(6) |
| O/N8 | 4a | 1 | 0.508(2) | 0.4677(12) | 0.885(6) |
| O/N9 | 4a | 1 | 0.398(2) | 0.2727(12) | 0.392(6) |
| O/N10 | 4a | 1 | 0.430(3) | 0.3336(15) | 0.896(7) |
| O/N11 | 4a | 1 | 0.942(3) | 0.4814(15) | 0.371(8) |
| O/N12 | 4a | 1 | 0.662(2) | 0.8571(12) | 0.893(6) |
| O/N13 | 4a | 1 | 0.128(3) | 0.5743(15) | 0.381(7) |
| O/N14 | 4a | 1 | 0.495(3) | 0.3982(13) | 0.383(6) |

If Sr and Ca, O and N and Si and Al are contained so as to satisfy a predetermined quantitative relationship in $Sr_2Si_7Al_3ON_{13}$ activated by Eu, the length of chemical bonds of Sr—N and Sr—O (proximity atomic distance) may change with the lattice constant. If the variation is within ±15% of the length of chemical bonds of Sr—N and Sr—O calculated from Table 1, the crystal structure of $Sr_2Si_7Al_3ON_{13}$ activated by Eu is retained and comparability can be recognized. The lattice constant can be determined by X-ray diffraction and neutron diffraction, and the length of chemical bonds of Sr—N and Sr—O can be calculated from atomic coordinates.

If Sr and Ca are contained so as to satisfy a predetermined quantitative relationship in $Sr_2Si_7Al_3ON_{13}$ activated by Eu, the distance between the closest elements around Eu that is a luminescence center in the crystal may change, so that a more or less change occurs in the luminescence property (peak wavelength/luminous efficiency/temperature property). However, as long as a crystal structure comparable to that of $Sr_2Si_7Al_3ON_{13}$ as described above is retained, a desired effect is obtained.

The luminescent material of this embodiment has as a host material an inorganic compound having a crystal structure substantially same as the crystal structure of $Sr_2Si_7Al_3ON_{13}$, and contains Eu as a luminescence center. The composition thereof can be represented by, for example, the following compositional formula 1.

$[(Sr_{1-p}Ca_p)_{1-x}Eu_x]_ASi_BAlO_CN_D$   compositional formula 1

From the reason described previously, p is 0.008≤p≤0.114, more preferably 0.025≤p≤0.114. When the aforementioned number of moles of Sr ($M_{Sr}$) and number of moles of Ca ($M_{Ca}$) are used, p is represented as $p=M_{Ca}/(M_{Sr}+M_{Ca})$.

If x, A, B, C and D satisfy the following conditions, a crystal structure comparable to that of $Sr_2Si_7Al_3ON_{13}$ can be possessed.

0<x≤0.4, 0.55≤A≤0.8, 2≤B≤3,
0<C≤0.6, 4≤D≤5 x, A, B, C and D preferably fall within the following range.
0.031≤x≤0.036, 0.61≤A≤0.68,
2.28≤B≤2.62, 0.16≤C≤0.43, 4.08≤D≤4.64

Figure 1B:
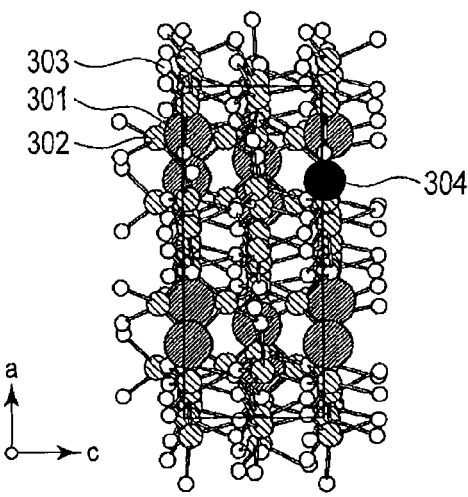
Figure 1C:
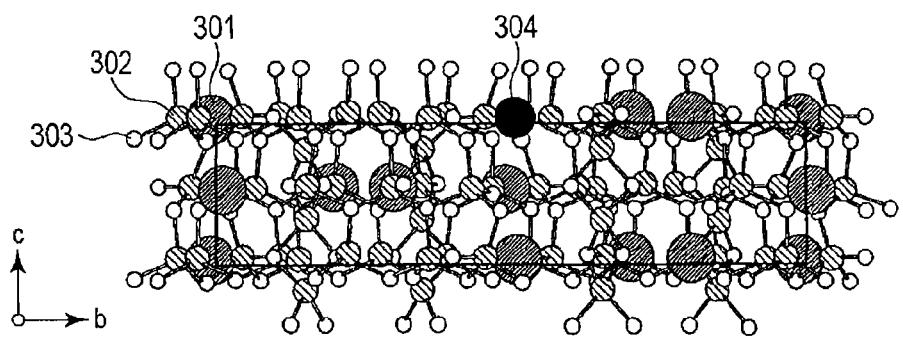

Based on the atomic coordinates shown in Table 1 above, the crystal structure of $Sr_2Si_7Al_3ON_{13}$ is as shown in FIG. 1. FIG. 1A is a projection view in the c axis direction, FIG. 1B is a projection view in the b axis direction, and FIG. 1C is a projection view in the a axis direction. In the figures, reference numeral 301 denotes a Sr atom, and the periphery thereof is surrounded by a Si atom or Al atom 302 and an O atom or N atom 303. In this embodiment, the Sr atom is partly replaced by a Ca atom 304. The Sr atom 301 is also partly replaced by Eu that is a luminescence center, but Eu is not shown in the figures because of its low ratio.

Figure 2:
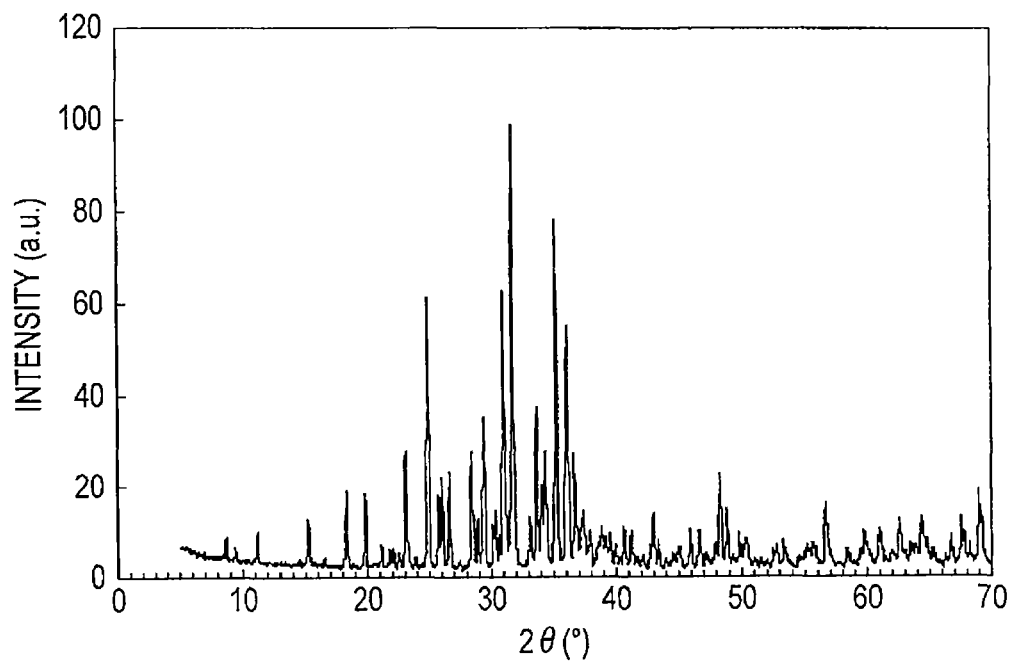
FIG. 2 is an X-ray diffraction (XRD) pattern of $Sr_2Si_7Al_3ON_{13}$.

The crystal of $Sr_2Si_7Al_3ON_{13}$ can be identified by powder X-ray diffraction (XRD) and neutron diffraction. An XRD pattern of the crystal of $Sr_2Si_7Al_3ON_{13}$ is shown in FIG. 2. The crystal of $Sr_2Si_7Al_3ON_{13}$ is orthorhombic, and this crystal belongs to the space group Pna 21. The space group of the crystal can be determined by single crystal XRD.

As described above, the red-emitting luminescent material of this embodiment is based on an inorganic compound having a crystal structure substantially same as the crystal structure of $Sr_2Si_7Al_3ON_{13}$. If the XRD pattern satisfies the predetermined conditions, and the composition satisfies the aforementioned compositional formula 1, it can be determined that the crystal structures are the same.

For example, mention is made of those having a part of Al in $Sr_2Si_7Al_3ON_{13}$ replaced by Si, those having a part of Si replaced by Al, those having a part of O replaced by N, and those having a part of N replaced by O. More specifically, $Sr_2Si_7Al_3O_{0.75}N_{13.25}$, $Sr_{1.9}Si_{7.1}Al_{2.9}O_{0.9}N_{13.1}$ and the like also have the crystal structure of $Sr_2Si_7Al_3ON_{13}$. One in which Sr and Ca are contained so as to satisfy a predetermined quantitative relationship in such a crystal structure activated by Eu is also the red-emitting luminescent material of this embodiment.

The red-emitting luminescent material of this embodiment has a low decrease in excitation spectrum in a region corresponding to extension of the wavelength of LED light by temperature rising because Sr and Ca are contained so as to satisfy a predetermined quantitative relationship. As a result, a decrease in luminous intensity can be suppressed. Moreover, in the red-emitting luminescent material of this embodiment, a good emission wavelength and quantum efficiency in the case of Eu-activated $Sr_2Si_7Al_3ON_{13}$ containing no Ca is in no way impaired.

If Sr and Ca are contained so as to satisfy a predetermined quantitative relationship in $Sr_2Si_7Al_3ON_{13}$ activated by Eu, the crystal structure thereof can be determined in the following manner from the diffraction peak position of an XRD pattern. Specifically, among diffraction peaks of the XRD pattern obtained, high-intensity ten peaks are designated as main peaks. If these ten main peaks are included at positions shown in Table 2 below, it can be determined that the crystal structure is same as a crystal structure with no Ca contained.

TABLE 2

| 2θ(°) |
|---|
| 15.1 ± 0.1 |
| 23.0 ± 0.1 |
| 24.9 ± 0.15 |
| 25.7 ± 0.2 |
| 26.0 ± 0.15 |
| 29.4 ± 0.1 |
| 31.0 ± 0.1 |
| 31.7 ± 0.15 |
| 33.1 ± 0.15 |
| 33.6 ± 0.15 |

TABLE 2-continued

| 2θ(°) |
|---|
| 34.0 ± 0.15 |
| 34.4 ± 0.2 |
| 35.2 ± 0.25 |
| 36.1 ± 0.1 |
| 36.6 ± 0.15 |
| 37.3 ± 0.2 |
| 40.6 ± 0.2 |
| 56.6 ± 0.25 |

As shown in the XRD pattern of FIG. 2, a peak of high diffraction intensity is also present at 28.4°, but the peak at this position has been confirmed to show a heterophase. Therefore, the peak at 28.4° is not included in main peaks for identifying the crystal structure of $Sr_2Si_7Al_3ON_{13}$.

If Sr and Ca are contained so as to satisfy a predetermined quantitative relationship in $Sr_2Si_7Al_3ON_{13}$ activated by Eu, ten main peaks are not necessarily identical for such luminescent materials. For example, the peak intensity ratio of the XRD pattern may vary. A luminescent material having the crystal structure of $Sr_2Si_7Al_3ON_{13}$ is a columnar crystal, and preferred orientation occurs when a sample is prepared for measurement of XRD. This may cause the peak intensity ratio of the XRD pattern to vary, but it can be said that the crystal structure is substantially same as the crystal structure of $Sr_2Si_7Al_3ON_{13}$ as long as ten main peaks are included at positions shown in Table 2 above.

The red-emitting luminescent material according to this embodiment can be manufactured by mixing raw material powders containing the elements and heating the resulting mixture.

As a Sr raw material, for example, nitrides of Sr such as $Sr_3N_2$, $Sr_2N$ and SrN can be used. The Sr nitride may be used alone or in combination. For a Ca raw material, for example, a nitride of Ca can be used, and an Al raw material can be selected from, for example, nitrides and oxides of Al. A Si raw material can be selected from, for example, nitrides and oxides of Si. As a raw material for Eu, a luminescence center element, for example, a nitride or an oxide of Eu can be used.

Nitrogen can be given from a nitride raw material, and oxygen can be given from an oxide raw material and a surface oxide film of a nitride raw material.

For example, $Sr_3N_2$, $Ca_3N_2$, AlN, $Si_3N_4$, $Al_2O_3$ and EuN are mixed in such a charge composition as to provide an intended composition. For obtaining a homogeneous mixed powder, it is desired to mix the raw material powders in a dry process in such an ascending order that a raw material powder, whose weight is the smallest, is first mixed.

For example, raw material powders can be mixed using a mortar in a glove box. The mixed powder is placed in a crucible, and heated under predetermined conditions to obtain a luminescent material according to this embodiment. For mixing raw material powders, a ball milling method is used, for example, a planetary ball milling can be employed. This method is particularly effective for elements added in a small amount such as, for example, Ca and Eu. The material of the crucible is not particularly limited, and may be boron nitride, silicon nitride, silicon carbide, carbon, aluminum nitride, sialon, aluminum oxide, molybdenum or tungsten.

The mixed powder is first heated by carrying out a heat treatment in a nitrogen atmosphere. In the atmosphere, hydrogen may be contained in an amount of up to 50% by weight. The time of the heat treatment in the nitrogen atmosphere is generally 0.2 hours or more, preferably 0.5 hours or more. If the heat treatment time is too short, a raw material may remain to degrade the luminescence property.

It is desirable to carry out the heat treatment in the nitrogen atmosphere at a pressure of atmospheric pressure or higher. The heat treatment carried out at a pressure of atmospheric pressure or higher is advantageous in that silicon nitride is hard to be decomposed. For fully suppressing decomposition of silicon nitride at a high temperature, the pressure is more preferably 5 atm or more, and the heating temperature is preferably in a range of 1500 to 2000° C. If the temperature is in this range, an intended sintered product is obtained without causing troubles such as sublimation of the raw materials or the product. The heating temperature is more preferably in a range of 1700 to 2000° C.

By carrying out the heat treatment in such an atmosphere, heating can be performed while suppressing oxidation of AlN.

After the heat treatment, a post-treatment such as cleaning is carried out as required to obtain a luminescent material according to the embodiment. When cleaning is carried out, it can be done by, for example, cleaning with pure water and/or acid. As an acid, for example, an inorganic acid such as sulfuric acid, nitric acid, hydrochloric acid or hydrofluoric acid, or an organic acid such as formic acid, acetic acid or oxalic acid, or a mixed acid thereof can be used. After cleaning, the product is preferably filtered under vacuum, dried by a drier, and then made to pass through a mesh to improve dispersibility.

A light-emitting device according to one embodiment includes a luminous layer containing a luminescent material, a light-emitting element that excites the luminescent material. Normally, for the light-emitting element that is used in the light-emitting device, an appropriate one is selected according to a luminescent material used. That is, it is required that light emitted from the light-emitting element can excite a luminescent material used. From this viewpoint, in this embodiment, a light-emitting element, which emits light having an emission peak in a wavelength range of 250 to 520 nm, is used.

In addition to emitting light having an emission peak in a wavelength range of 250 to 520 nm, the light-emitting element that is used in the light-emitting device of one embodiment has such a property that the peak wavelength of light emitted at steady-state driving is extended by at least 6 nm as compared to the peak wavelength at initial driving. The time of steady-state driving refers to a state in which the temperature rises by driving and becomes constant. On the other hand, the time of initial driving refers to 5 seconds or less from the start of driving. If the peak wavelength of light emitted at steady-state driving shifts by at least 6 nm toward the long wavelength side, the effect of the luminescent material according to this embodiment is obtained. As the shift amount of the peak wavelength increases, the effect is further increased.

Figure 3:
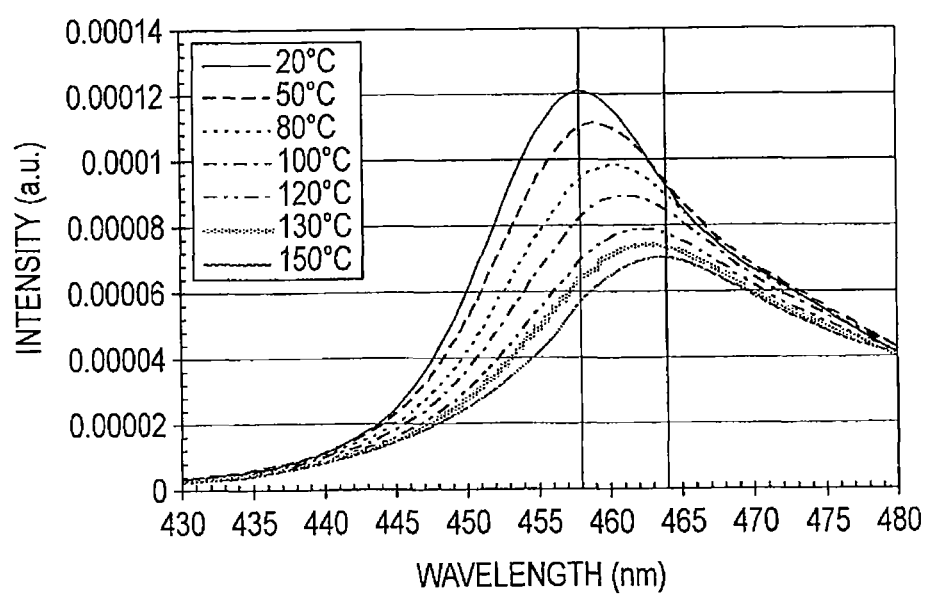
FIG. 3 is a graphic view showing a change in peak wavelength of LED light emitted from a light-emitting device.
Figure 6:
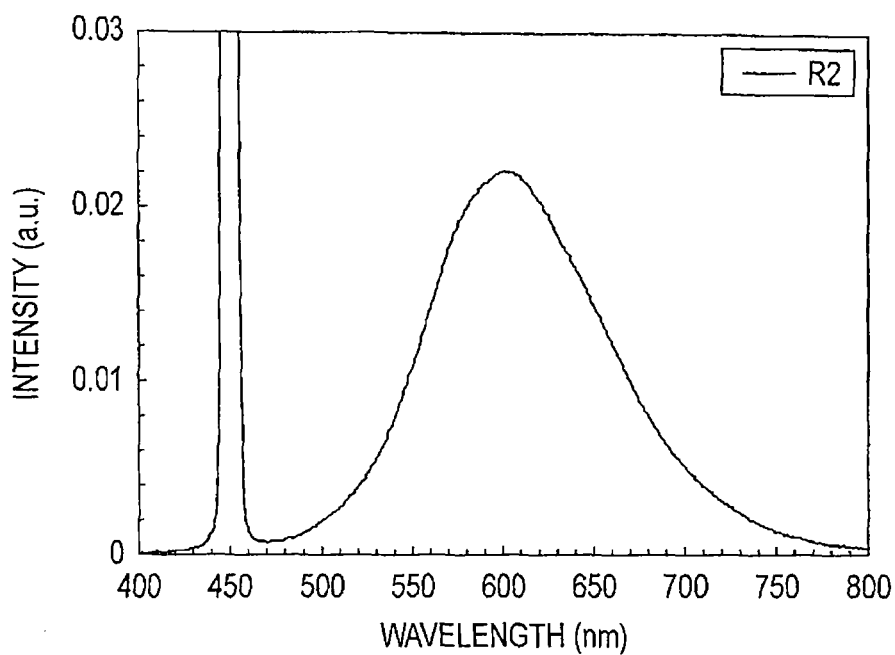
FIG. 6 is a luminescence emission spectrum when a luminescent material of Example is excited with light having a peak wavelength of 450 nm.
Figure 7:
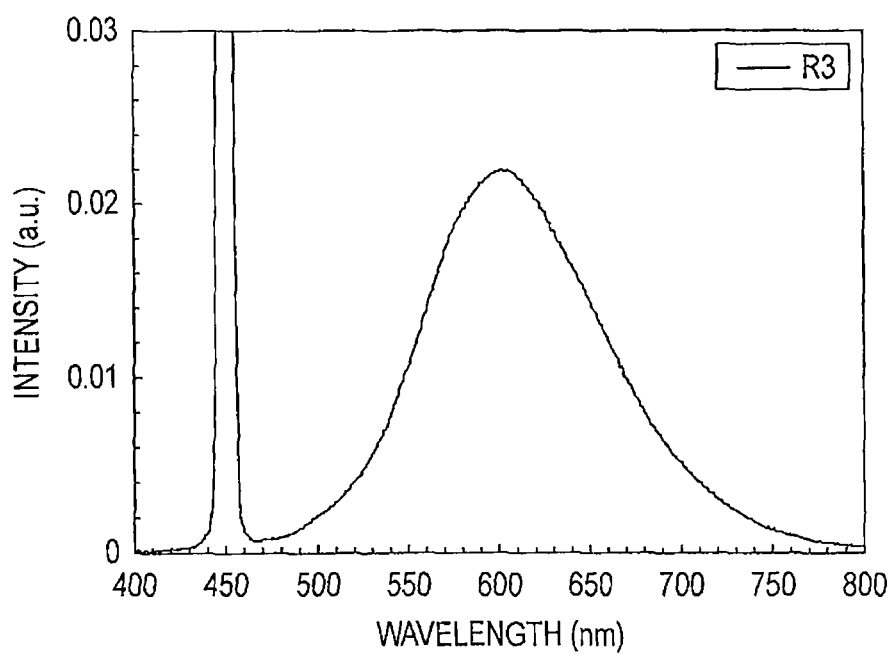
FIG. 7 is a luminescence emission spectrum when a luminescent material of Example is excited with light having a peak wavelength of 450 nm.
Figure 8:
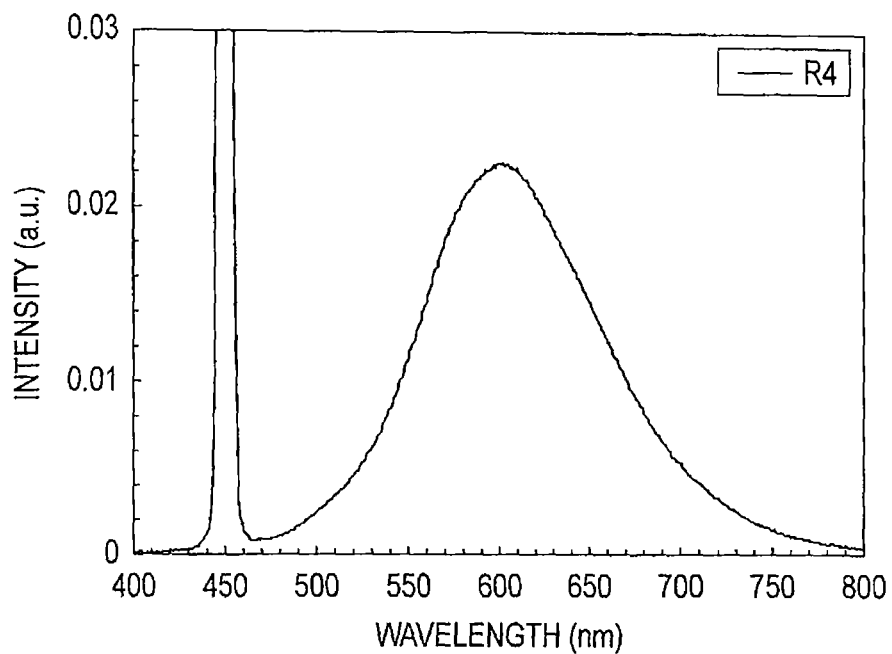
FIG. 8 is a luminescence emission spectrum when a luminescent material of Example is excited with light having a peak wavelength of 450 nm.
Figure 9:
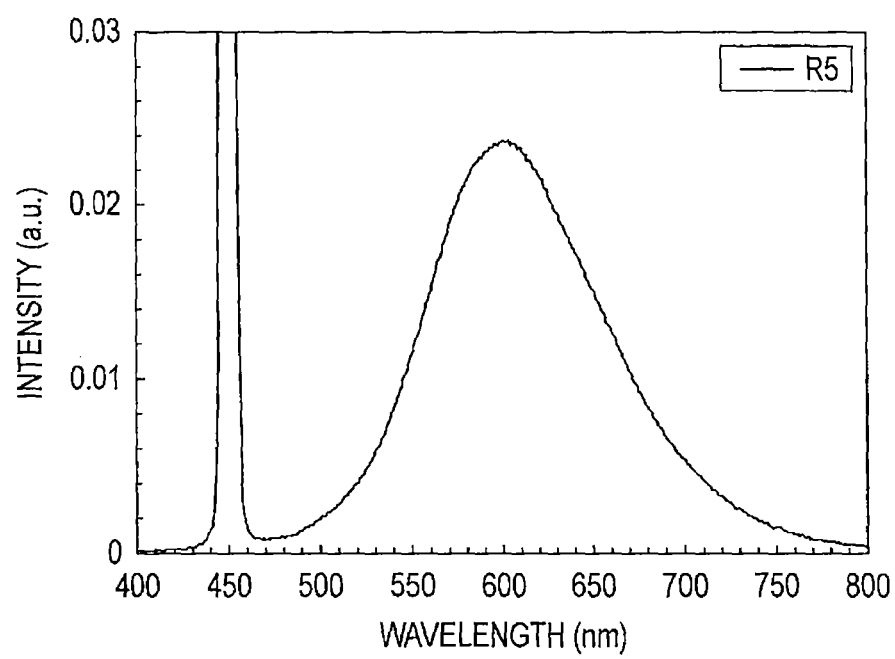
FIG. 9 is a luminescence emission spectrum when a luminescent material of Example is excited with light having a peak wavelength of 450 nm.

The peak wavelength of a light-emitting element (for example InGaN) is, for example, about 457.9 nm at 20° C. as shown in FIG. 3. The peak wavelength shifts toward the long wavelength side as the temperature rises, and the peak wavelength at 150° C. is, for example, about 463.9 nm. It is apparent that the peak wavelength at 150° C. shifts by about 6 nm toward the long wavelength side as compared to that at 20° C. Depending on the type of light-emitting element, the peak wavelength at a high temperature such as 150° C. may shift toward further the long wavelength side.

A cause for the peak wavelength at steady-state driving to shift toward the long wavelength side as compared to that at initial driving is heat as described above. Generally, if the introduced current is high (for example 350 mA or more), the temperature of the element itself is elevated. Even if the introduced current is only about 10 mA or less, the peak wavelength shifts toward the long wavelength side in the case described below. For example, the efficiency of a LED itself is low, and thus energy other than a luminescence is converted into heat to elevate the temperature of the element, or the heat conductivity of a package is so low that heat is accumulated in the element.

The light-emitting device according to one embodiment can have a configuration shown in a schematic view of FIG. 4.

In the light-emitting device shown in FIG. 4, leads 101 and 102 and a package cup 103 are placed on a base material 100. The base material 100 and the package cup 103 are made of resin. The package cup 103 had a recess 105 with the upper section being wider than the bottom section, and the side surface of the recess acts as a reflecting surface 104.

A light-emitting element 106 is mounted at the center of the substantially circular bottom surface of the recess 105 by an Ag paste or the like. The light-emitting element 106 that can be used is configured such that light having an emission peak in a wavelength range of 250 to 520 nm is emitted, and the peak wavelength of light emitted at steady-state driving shifts by at least 6 nm toward the long wavelength side as compared to that at initial driving as described above. The light-emitting elements include, for example, light-emitting diodes and laser diodes. Specifically, the light-emitting elements include, but are not limited to, semiconductor light-emitting elements of GaN type and the like.

A p electrode and an n electrode (not shown) of the light-emitting element 106 are connected, respectively, to the lead 101 and the lead 102 by bonding wires 107 and 108 made of Au and the like. The arrangement of leads 101 and 102 may appropriately be changed.

As the light-emitting element 106, a flip tip type light-emitting element having an n electrode and a p electrode on the same surface can also be used. In this case, a semiconductor light-emitting device having high reliability and high luminance is obtained by eliminating problems caused by a wire such as breakage and detachment of the wire and absorption of light by the wire. The following configuration can also be achieved using a light-emitting element having an n-type substrate. An n electrode is formed on the back surface of the n-type substrate of the light-emitting element, and a p electrode is formed on the upper surface of a p-type semiconductor layer laminated on the substrate. The n electrode is mounted on a lead, and the p electrode is connected to the other lead by a wire.

Two kinds of light-emitting elements radiating lights having different wavelengths, for example a light-emitting element radiating light having an emission peak in a wavelength range of 380 to 490 nm and a light-emitting element radiating light having an emission peak in a wavelength range of 480 to 550 nm, may be used in combination. The use of these two kinds of light-emitting elements is advantageous in that only one kind of luminescent material is used.

A luminous layer 109 containing a luminescent material 110 according to one embodiment is placed in the recess 105 of the package cup 103. In the luminous layer 109, the luminescent material 110 is contained in an amount of 5 to 50% by mass in a resin layer 111 including, for example, a silicone resin. As described above, the luminescent material according to this embodiment has as a host material a compound having a crystal structure substantially same as the crystal structure of $Sr_2Si_7Al_3ON_{13}$, and this oxynitride has high covalency. Thus, the luminescent material according to this embodiment is hydrophobic, and has a very good compatibility with a resin. Therefore, scattering at an interface between the resin layer and the luminescent material is significantly suppressed to improve the light extraction efficiency.

The red-emitting luminescent material according to this embodiment has a low decrease in luminous intensity even when the temperature rises. A LED that excites this red-emitting luminescent material has a rise in temperature by steady-state driving, but even when the peak wavelength of LED light shifts toward the long wavelength side by temperature rising, the red-emitting luminescent material according to this embodiment has a low decrease in intensity of the excitation spectrum within this range. That is, there is obtained a light-emitting device which has a small variation between a blue light component of the LED and a red light component even in driving under a high load because a decrease in luminous intensity is low when the LED is being driven. The light emitting device shown in FIG. 4 can emit a luminescence which is bright and has a small color shift even when the temperature rises, and the color of the luminescence changes from reddish violet to pink.

The size and type of the light-emitting element 106 and the dimension and shape of the recess 105 may be appropriately changed.

The light-emitting device according to one embodiment is not limited to the package cup type shown in FIG. 4, but may be appropriately changed. Specifically, even in the case of a bullet-shaped LED and a surface-mounted LED, a comparable effect can be obtained by applying the luminescent material of the embodiment.

The luminous layer 109 may contain a green-emitting luminescent material together with the red-emitting luminescent material of this embodiment. The green-emitting luminescent material is not particularly limited as long as it shows a luminescence having a peak in a wavelength range of 480 to 550 nm, and commercially available one may be used. For example, mention is made of β sialon:Eu and the like. In this case, a white light emitting device can be formed by combination with, for example, a LED that emits light having an emission peak in a wavelength range of 380 to 490 nm, as the light-emitting element 106.

As described previously, the red-emitting luminescent material according to this embodiment has a low decrease in intensity of the excitation spectrum in a range of a shift in wavelength from the wavelength at initial driving which is shown by the LED at steady-state driving, and therefore has a low decrease in luminous intensity when the LED is being driven. Even in driving under a high load, the balance among a light component of the LED and a red color component and a green color component is inhibited from being broken, and a white light-emitting device having a small "color shift" can be thus obtained.

A yellow-emitting luminescent material can also be used in place of a green-emitting luminescent material. In this case, a white light-emitting device having a small color shift can also be obtained by using as a light-emitting element a LED that emits light having an emission peak in a wavelength range of 380 to 490 nm as described above. The yellow-emitting luminescent material is not particularly limited as long as it shows a luminescence having a peak in a wavelength range of 530 to 600 nm, and a commercially available one may be used. For example, mention is made of $Y_3Al_5O_{12}$:Ce and the like.

Further, the luminous layer 109 may contain a green-emitting luminescent material and a blue-emitting luminescent material together with the red-emitting luminescent material of this embodiment. In this case, a LED that emits light having an emission peak in a wavelength range of 250 to 430 nm can be used as the light-emitting element 106. The blue-emitting luminescent material is not particularly limited, and a commercially available one may be used. For example, mention is made of $BaMgAl_{10}O_{17}$:Eu and the like.

In this case, a white light-emitting device is obtained as in the case described above. As described above, the red-emitting luminescent material according to this embodiment has a low decrease in luminous intensity even when the temperature rises. The red-emitting luminescent material according to this embodiment has a low decrease in intensity even when the temperature of a LED exciting a luminescent material rises by steady-state driving, and the peak wavelength of LED light emitted shifts toward the long wavelength side.

That is, since a decrease in intensity is low when the LED is being driven, the balance among a light component of the LED and a red color component and a green color component and a blue light component is inhibited from being broken. As a result, a white light-emitting device having a small "color shift" can be obtained. Moreover, luminescent materials of three colors are further contained in a luminous layer, and therefore the color rendering property can be improved as compared to the aforementioned white light-emitting device by combination of a blue LED and a yellow luminescent material.

As described above, the red-emitting luminescent material of this embodiment has a high quantum yield and a good temperature property. In this red-emitting luminescent material, a decrease in luminous intensity is low even when the temperature rises, and a decrease in luminous intensity by a shift in excitation wavelength at driving a LED is low. Therefore, in the light-emitting device of this embodiment containing the luminescent material of this embodiment in the luminous layer, the color shift is suppressed even at high-power driving.

Specific examples of the luminescent material and light-emitting device will be shown below.

Example 1

$Sr_3N_2$, $Ca_3N_2$, EuN, $Si_3N_4$, $Al_2O_3$ and AlN were prepared as raw material powders and each weighed in a vacuum glove box. The blending amounts of $Sr_3N_2$, $Ca_3N_2$, EuN, $Si_3N_4$, $Al_2O_3$ and AlN were 2.807 g, 0.007 g, 0.149 g, 4.911 g, 0.510 g and 1.435 g, respectively. The weighed raw material powders were mixed in a dry process by a planetary ball mill. The obtained mixture was filled in a boron nitride (BN) crucible, and heated at 1850° C. for 0.5 hours in a $N_2$ atmosphere at 7.5 atm. Further, for obtaining a single-phase red-emitting luminescent material, classification was performed by dry sieving using several sieves having different apertures.

A luminescent material (R1) of this Example was thus obtained. The design composition of the luminescent material (R1) is $[(Sr_{0.995}Ca_{0.005})_{0.97}Eu_{0.03}]_2Si_7Al_3ON_{13}$.

The obtained luminescent material (R1) was a powder, the body color of which was orange, and when it was excited with black light, a red luminescence was observed. In FIG. 5 is shown a luminescence emission spectrum of the red-emitting luminescent material (R1) when excited with light having a peak wavelength of 450 nm. The apparatus used for evaluation is a PL absolute quantum yield measurement device (manufactured by Hamamatsu Photonics K.K.). As shown in the figure, a luminescence having a peak in a wavelength range of 570 to 670 nm was observed.

Examples 2 to 7

Luminescent materials (R2 to R7) of Examples 2 to 7 were synthesized by a method same as that in Example 1 except that the blending amounts of $Sr_3N_2$ and $Ca_3N_2$ among the raw material powders were changed to values shown in Table 3 below.

TABLE 3

|  | $Sr_3N_2$ | $Ca_3N_2$ |
|---|---|---|
| Example 2(R2) | 2.793 | 0.014 |
| Example 3(R3) | 2.765 | 0.029 |
| Example 4(R4) | 2.723 | 0.050 |
| Example 5(R5) | 2.680 | 0.072 |
| Example 6(R6) | 2.610 | 0.108 |
| Example 7(R7) | 2.539 | 0.144 |

The design compositions of luminescent materials (R2 to R7) are as follows.

$[(Sr_{0.99}Ca_{0.01})_{0.97}Eu_{0.03}]_2Si_7Al_3ON_{13}$ (R2)

$[(Sr_{0.98}Ca_{0.02})_{0.97}Eu_{0.03}]_2Si_7Al_3ON_{13}$ (R3)

$[(Sr_{0.965}Ca_{0.035})_{0.97}Eu_{0.03}]_2Si_7Al_3ON_{13}$ (R4)

$[(Sr_{0.95}Ca_{0.05})_{0.97}Eu_{0.03}]_2Si_7Al_3ON_{13}$ (R5)

$[(Sr_{0.925}Ca_{0.075})_{0.97}Eu_{0.03}]_2Si_7Al_3ON_{13}$ (R6)

$[(Sr_{0.9}Ca_{0.1})_{0.97}Eu_{0.03}]_2Si_7Al_3ON_{13}$ (R7)

Each of the obtained luminescent materials (R2 to R7) was a powder, the body color of which was orange, and when it was excited with black light, a red luminescence was observed. Luminescence emission spectra obtained by exciting red-emitting luminescent materials (R2 to R7) by radiating light having a peak wavelength of 450 nm using a light-emitting element same as that described above are shown in FIGS. 6 to 11, respectively. As shown in the figures, a luminescence having a peak in a wavelength range of 570 to 670 nm was observed from each of the luminescent materials. The luminous intensity reaches about 106% at minimum (Examples 1 and 2) in terms of a ratio to that of Comparative Example 1 shown below, and 125% at maximum (Example 7) in terms of a ratio to that of Comparative Example 1.

Comparative Examples 1 and 2

Luminescent materials (H1 and H2) of Comparative Examples 1 and 2 were synthesized by a method same as that in Example 1 except that the blending amounts of $Sr_3N_2$ and $Ca_3N_2$ among the raw material powders were changed to values shown in Table 4 below.

TABLE 4

|  | $Sr_3N_2$ | $Ca_3N_2$ |
|---|---|---|
| Comparative Example 1(H1) | 2.821 | 0 |
| Comparative Example 2(H2) | 2.257 | 0.288 |

The design compositions of luminescent materials (H1 and H2) are as follows.

$(Sr_{0.97}Eu_{0.03})_2Si_7Al_3ON_{13}$ (H1)

$[(Sr_{0.8}Ca_{0.2})_{0.97}Eu_{0.03}]_2Si_7Al_3ON_{13}$ (H2)

Figure 12:
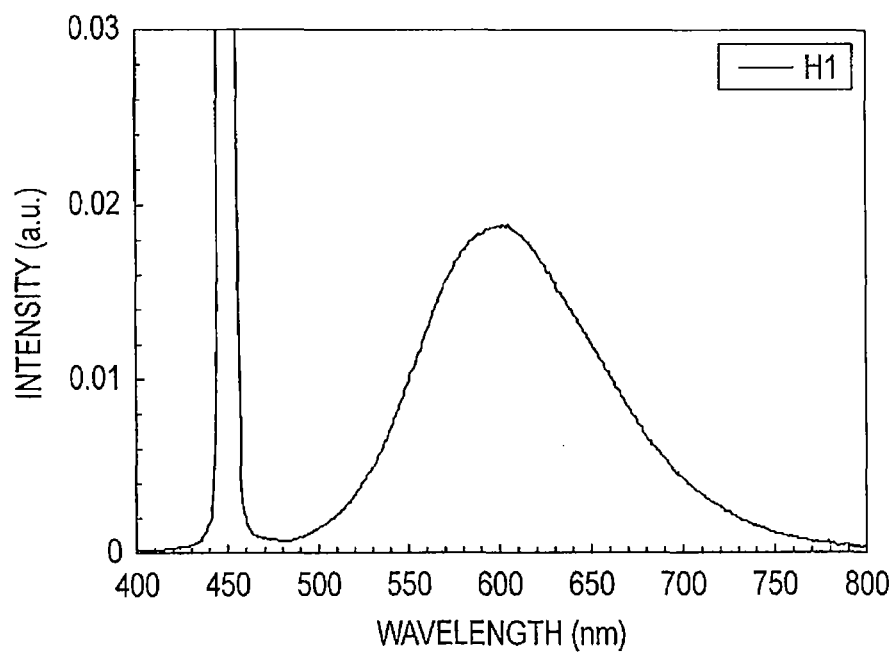
FIG. 12 is a luminescence emission spectrum when a luminescent material of Example is excited with light having a peak wavelength of 450 nm.
Figure 13:
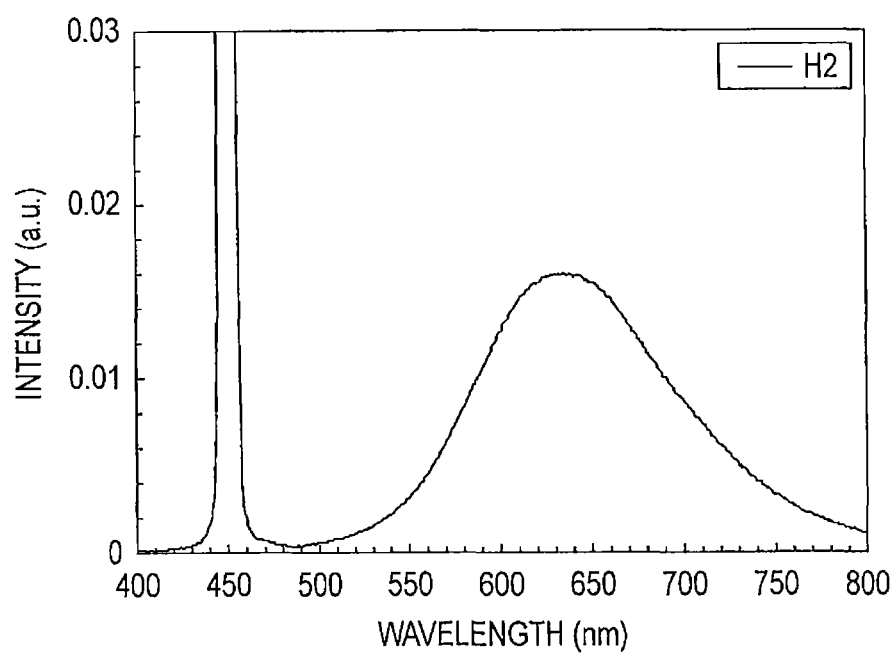
FIG. 13 is a luminescence emission spectrum when a luminescent material of Example is excited with light having a peak wavelength of 450 nm.

Each of the obtained luminescent materials (H1 and H2) was a powder, the body color of which was orange, and when it was excited with black light, a red luminescence was observed. Luminescence emission spectra obtained by exciting red-emitting luminescent materials (H1 and H2) by radiating light having a peak wavelength of 450 nm using a light-emitting element same as that described above are shown in FIGS. 12 and 13, respectively.

The luminescent material (H1) of Comparative Example 1 shows a luminescence having a peak in a wavelength range of 570 to 670 nm.

The luminescence of the luminescent material (H2) of comparative Example 2 has a peak in a wavelength range of 570 to 670 nm, but its luminescence peak wavelength is extended as compared to luminescent materials of Examples 1 to 7 and Comparative Example 1. Moreover, it has been confirmed that the luminous intensity is only 96% in terms of a ratio to Comparative Example 1, and lower than the luminous intensities of luminescent materials of Examples 1 to 7 and Comparative Example 1.

XRD patterns of luminescent materials of Examples 1 to 7 and Comparative Examples 1 and 2 are shown in FIGS. 14 to 22, respectively. XRD patterns were determined by powder X-ray diffractometry using M18XHF22-SRA manufactured by former MacScience Inc. In each pattern, a plurality of peaks are present, and it is apparent that luminescent materials (R1 to R7 and H1) of Examples 1 to 7 and Comparative Example 1 have same tendencies. However, the XRD pattern of the luminescent material (H2) of Comparative Example 2 shown in FIG. 22 is different from the XRD patterns of other luminescent materials in that peaks as large as peaks present at other positions are present 28.9°, 31.3° and 30.7°. Since these peaks show heterophase, it is thought that unexplained heterophases are present in the luminescent material (H2) of Comparative Example 2.

For each XRD pattern, ten peaks of higher intensities were selected, and designated as main peaks, and positions (2θ) thereof were marked with "○" in Table 5 below. If the ten peaks are present in eighteen peaks listed in Table 5, it can be determined that the crystal structure of $Sr_2Si_7Al_3ON_{13}$ is possessed.

TABLE 5

| 2θ(°) | R1 | R2 | R3 | R4 | R5 | R6 | R7 | H1 | H2 |
|---|---|---|---|---|---|---|---|---|---|
| 15.1 ± 0.1 | | | | | | | | | |
| 23.0 ± 0.1 | | | | | | | ○ | | |
| 24.9 ± 0.15 | ○ | ○ | ○ | ○ | ○ | ○ | ○ | ○ | ○ |
| 25.7 ± 0.2 | ○ | ○ | ○ | ○ | ○ | ○ | ○ | | |
| 26.0 ± 0.15 | | | ○ | | ○ | ○ | | | |
| 29.4 ± 0.1 | ○ | ○ | ○ | ○ | ○ | ○ | ○ | | |
| 31.0 ± 0.1 | ○ | ○ | ○ | ○ | ○ | ○ | ○ | ○ | |
| 31.7 ± 0.15 | ○ | ○ | ○ | ○ | ○ | ○ | ○ | ○ | |
| 33.1 ± 0.15 | | | | | | | | | |
| 33.6 ± 0.15 | ○ | ○ | ○ | ○ | ○ | ○ | | ○ | |
| 34.0 ± 0.15 | | | | | | | | ○ | ○ |
| 34.4 ± 0.2 | | | ○ | ○ | | ○ | | | |
| 35.2 ± 0.25 | ○ | ○ | ○ | ○ | ○ | ○ | ○ | ○ | ○ |
| 36.1 ± 0.1 | ○ | ○ | ○ | ○ | ○ | ○ | ○ | ○ | |
| 36.6 ± 0.15 | ○ | ○ | ○ | ○ | ○ | | ○ | ○ | |
| 37.3 ± 0.2 | ○ | | | | | ○ | ○ | | |
| 40.6 ± 0.2 | | | | | | | | | |
| 56.6 ± 0.25 | | | | | | | | | |

In luminescent materials (R1 to R7 and H1) of Examples 1 to 7 and Comparative Example 1, ten main peaks are present at predetermined positions as shown in Table 5 above. Therefore, it is apparent that these luminescent materials have a crystal structure of $Sr_2Si_7Al_3ON_{13}$.

In contrast, in the luminescent material (H2) of Comparative Example 2, only seven main peaks are present at predetermined positions. Therefore, it is apparent that the luminescent material of Comparative Example 2 does not have a crystal structure completely of $Sr_2Si_7Al_3ON_{13}$.

Results of chemical analyses performed by inductively coupled plasma (ICP) for luminescent materials of Examples 1 to 7 and Comparative Examples 1 and 2 are summarized in Table 6 below. Values shown in Table 6 are molar ratios with the amounts of analyzed elements normalized by the Al amount.

TABLE 6

| | Sr | Ca | Eu | Si | Al | O | N |
|---|---|---|---|---|---|---|---|
| Example 1(R1) | 0.62 | 0.005 | 0.021 | 2.32 | 1 | 0.34 | 4.19 |
| Example 2(R2) | 0.61 | 0.009 | 0.021 | 2.29 | 1 | 0.32 | 4.27 |
| Example 3(R3) | 0.59 | 0.015 | 0.021 | 2.28 | 1 | 0.39 | 4.08 |
| Example 4(R4) | 0.60 | 0.027 | 0.021 | 2.36 | 1 | 0.37 | 4.19 |
| Example 5(R5) | 0.63 | 0.043 | 0.021 | 2.49 | 1 | 0.41 | 4.38 |
| Example 6(R6) | 0.60 | 0.056 | 0.022 | 2.42 | 1 | 0.43 | 4.21 |
| Example 7(R7) | 0.57 | 0.073 | 0.021 | 2.38 | 1 | 0.42 | 4.14 |
| Comparative Example 1(H1) | 0.53 | 0 | 0.018 | 2.03 | 1 | 0.31 | 3.71 |
| Comparative Example 2(H2) | 0.56 | 0.136 | 0.021 | 2.46 | 1 | 0.48 | 4.50 |

Composition parameters in compositional formula 1 are calculated based on values shown in Table 6 above, and summarized in Table 7 below.

TABLE 7

| | $[(Sr_{1-p}Ca_p)_{1-x}Eu_x]_A Si_B AlO_C N_D$ | | | | | |
|---|---|---|---|---|---|---|
| | p | x | A | B | C | D |
| Example 1(R1) | 0.008 | 0.033 | 0.65 | 2.32 | 0.34 | 4.19 |
| Example 2(R2) | 0.014 | 0.032 | 0.64 | 2.29 | 0.32 | 4.27 |
| Example 3(R3) | 0.025 | 0.033 | 0.63 | 2.28 | 0.39 | 4.08 |
| Example 4(R4) | 0.044 | 0.033 | 0.65 | 2.36 | 0.37 | 4.19 |
| Example 5(R5) | 0.064 | 0.031 | 0.69 | 2.49 | 0.41 | 4.38 |
| Example 6(R6) | 0.085 | 0.032 | 0.68 | 2.42 | 0.43 | 4.21 |
| Example 7(R7) | 0.114 | 0.031 | 0.66 | 2.38 | 0.42 | 4.14 |
| Comparative Example 1(H1) | 0 | 0.033 | 0.55 | 2.03 | 0.31 | 3.71 |
| Comparative Example 2(H2) | 0.195 | 0.029 | 0.72 | 2.46 | 0.48 | 4.50 |

In each of luminescent materials of Examples 1 to 7, p in compositional formula 1 is in a range of 0.008 to 0.114 inclusive as shown in Table 7 above. Comparative Example 1 contains no Ca (p=0), and Comparative 2 contains Ca excessively (p=0.195).

The peak wavelengths, luminous efficiencies and temperature properties of luminescent materials of Examples 1 to 7 and Comparative Examples 1 and 2 are summarized in Table 8 below.

TABLE 8

| | Peak wavelength | Luminous efficiency | Temperature property |
|---|---|---|---|
| Example 1(R1) | 602 nm | 106% | 99% |
| Example 2(R2) | 602 nm | 106% | 100% |
| Example 3(R3) | 602 nm | 116% | 100% |
| Example 4(R4) | 602 nm | 116% | 100% |
| Example 5(R5) | 602 nm | 116% | 101% |
| Example 6(R6) | 602 nm | 120% | 100% |
| Example 7(R7) | 602 nm | 125% | 99% |
| Comparative Example 1(H1) | 602 nm | 100% | 100% |
| Comparative Example 2(H2) | 630 nm | 96% | 100% |

The peak wavelength of luminescence was read from luminescence emission spectra when exciting the luminescent material with light having a peak wavelength of 450 nm (FIGS. 5 to 13), the luminous efficiency was determined by multiplying the values of a quantum efficiency obtained by a PL absolute quantum yield measurement device (manufactured by Hamamatsu Photonics K.K.) and an absorptivity, and a value normalized with a comparative product 1 was used. The temperature property was determined in the following manner. A luminescent material was heated by a heater in a PL absolute quantum yield measurement device same as that described above to obtain a peak intensity at 150° C. ($I_{150}$). The temperature property was calculated from ($I_{150}/I_{RT}$) using a peak intensity ($I_{RT}$) at room temperature, and a value normalized with a comparative example 1 was used.

As shown in Table 8 above, the luminous efficiencies of luminescent materials of Examples 1 to 7 reach 106% at minimum and 125% at minimum as compared to the case where no Ca is contained (Comparative Example 1).

In contrast, in the luminescent material of Comparative Example 2 containing Ca excessively, the peak wavelength of luminescence changes, and also the luminous efficiency is only 96%. As described with reference to FIG. 22, this is thought to be ascribable to the presence of heterophases in the luminescent material (H2) of Comparative Example 2.

If Sr and Ca are contained so as to satisfy a predetermined quantitative relationship, the luminescence property (peak wavelength, luminous efficiency and temperature property) is in no way impaired. Moreover, as described later, in a luminescent material containing Sr and Ca so as to satisfy a predetermined quantitative relationship, a decrease in luminous intensity is suppressed when the temperature rises.

Example 8

$Sr_3N_2$, $Ca_3N_2$, EuN, $Si_3N_4$ and AlN were prepared as raw material powders and each weighed in a vacuum glove box. The blending amounts of $Sr_3N_2$, $Ca_3N_2$, EuN, $Si_3N_4$ and AlN were 2.533 g, 0.072 g, 0.166 g, 4.911 g and 1.844 g, respectively. The weighed raw material powders were mixed in a dry process in an agate mortar. The obtained mixture was filled in a boron nitride crucible, and heated at 1800° C. for an hour in a $N_2$ atmosphere at 7.5 atm to obtain a luminescent material (R8) of this Example.

The design composition of the luminescent material (R8) is $[(Sr_{0.95}Ca_{0.05})_{0.965}Eu_{0.035}]_{1.9}Si_7Al_3N_{14}$.

Example 9

Raw material powders same as those in Example 8 were prepared except that the blending amount of $Si_3N_4$ was changed to 5.086 g and the blending amount of AlN was changed to 1.691 g. The weighed raw material powders were mixed in a dry process in an agate mortar. The obtained mixture was filled in a boron nitride crucible, and heated in the following manner in a $N_2$ atmosphere at 7.5 atm. Specifically, the mixture was heated at 1800° C. for an hour, ground, then placed in the crucible again, and heated at 1800° C. for 0.5 hours. This process was repeated three times to obtain a luminescent material (R9) of this Example.

The design composition of the luminescent material (R9) is $[(Sr_{0.95}Ca_{0.05})_{0.965}Eu_{0.035}]_{1.9}Si_{7.25}Al_{2.75}N_{14}$.

Comparative Example 3

Raw material powders same as those in Example 8 were prepared except that the blending amount of $Sr_3N_2$ was changed to 2.667 g, and $Ca_3N_2$ was not used. The weighed raw material powders were mixed in a dry process in an agate mortar. The obtained mixture was filled in a boron nitride crucible, and heated at 1800° C. for 2 hours in a $N_2$ atmosphere at 7.5 atm to obtain a luminescent material (H3) of this Comparative Example. The design composition of the luminescent material (H3) is $(Sr_{0.965}Eu_{0.035})_{1.9}Si_7Al_3N_{14}$.

Comparative Example 4

Raw material powders same as those in Example 9 were prepared except that the blending amount of $Sr_3N_2$ was changed to 2.667 g, and $Ca_3N_2$ was not used. A luminescent material (H4) of this Comparative Example was obtained by a firing method same as that in Example 3. The design composition of the luminescent material (H4) is $(Sr_{0.965}Eu_{0.035})_{1.9}Si_{7.25}Al_{2.75}N_{14}$.

Each of luminescent materials (R8, R9, H3 and H4) of Examples 8 and 9 and Comparative Examples 3 and 4 was a powder, the body color of which was orange, and when it was excited with black light, a red luminescence was observed. Luminescence emission spectra obtained by exciting red-emitting luminescent materials (R8, R9, H3 and H4) by radiating light having a peak wavelength of 450 nm using a light-emitting element same as that described above are shown in FIGS. 23 to 26, respectively. As shown in the figures, a luminescence having a peak in a wavelength range of 570 to 670 nm was observed in each of the luminescent materials. The luminous efficiencies of Examples 8 and 9 are both about 100% and 97% in terms of a ratio to that of Comparative Example 3 and a ratio to that of Comparative Example 4, respectively.

XRD patterns of red-emitting luminescent materials of Examples 8 and 9 and Comparative Examples 3 and 4 are shown in FIGS. 27 to 30, respectively. The XRD pattern was determined in the same manner as described above. In each pattern, a plurality of peaks are present. For each XRD pattern, ten peaks of higher intensities were selected, and designated as main peaks, and positions (2θ) thereof were marked with "○" in Table 9 below.

TABLE 9

| 2θ(°) | R8 | R9 | H3 | H4 |
|---|---|---|---|---|
| 15.1 ± 0.1 | | | ○ | ○ |
| 23.0 ± 0.1 | | | | |
| 24.9 ± 0.15 | ○ | ○ | ○ | ○ |
| 25.7 ± 0.2 | | | | |
| 26.0 ± 0.15 | ○ | ○ | ○ | |
| 29.4 ± 0.1 | ○ | ○ | ○ | ○ |
| 31.0 ± 0.1 | ○ | ○ | ○ | ○ |
| 31.7 ± 0.15 | ○ | ○ | ○ | ○ |
| 33.1 ± 0.15 | ○ | ○ | ○ | |
| 33.6 ± 0.15 | | ○ | | ○ |
| 34.0 ± 0.15 | | | | |
| 34.4 ± 0.2 | | | | |
| 35.2 ± 0.25 | ○ | ○ | ○ | ○ |
| 36.1 ± 0.1 | ○ | ○ | ○ | ○ |
| 36.6 ± 0.15 | | ○ | ○ | ○ |
| 37.3 ± 0.2 | | | | |
| 40.6 ± 0.2 | ○ | | | |
| 56.6 ± 0.25 | ○ | | | |

In luminescent materials (R8, R9, H3 and H4) of Examples 8 and 9 and Comparative Examples 3 and 4, ten main peaks are present at predetermined positions as shown in Table 9 above. Therefore, it is apparent that these luminescent materials have a crystal structure of $Sr_2Si_7Al_3ON_{13}$.

Results of chemical analyses performed by ICP for luminescent materials of Examples 8 to 9 and Comparative Examples 3 and 4 are summarized in Table 10 below. Values shown in Table 10 are molar ratios with the amounts of analyzed elements normalized by the Al amount.

TABLE 10

|  | Sr | Ca | Eu | Si | Al | O | N |
|---|---|---|---|---|---|---|---|
| Example 8(R8) | 0.56 | 0.031 | 0.022 | 2.34 | 1 | 0.16 | 4.29 |
| Example 9(R9) | 0.61 | 0.034 | 0.024 | 2.62 | 1 | 0.17 | 4.64 |
| Comparative Example 3(H3) | 0.59 | 0 | 0.021 | 2.34 | 1 | 0.16 | 4.29 |
| Comparative Example 4(H4) | 0.66 | 0 | 0.026 | 2.60 | 1 | 0.19 | 4.86 |

Luminescent materials of Examples 8 and 9 have a N/O ratio of about 26.81 to 27.29. When compared to the N/O ratio of 13.34 or less in the luminescent materials of Examples 1 to 7 described above, luminescent materials of Examples 8 and 9 have a nitrogen-rich composition.

Composition parameters in compositional formula 1 are calculated based on values shown in Table 10 above, and summarized in Table 11 below.

TABLE 11

| | $[(Sr_{1-p}Ca_p)_{1-x}Eu_x]_A Si_B AlO_C N_D$ | | | | | |
|---|---|---|---|---|---|---|
| | p | x | A | B | C | D |
| Example 8(R8) | 0.053 | 0.036 | 0.61 | 2.34 | 0.16 | 4.29 |
| Example 9(R9) | 0.052 | 0.035 | 0.67 | 2.62 | 0.17 | 4.64 |
| Comparative Example 3(H3) | 0 | 0.035 | 0.61 | 2.34 | 0.16 | 4.29 |
| Comparative Example 4(H4) | 0 | 0.038 | 0.68 | 2.60 | 0.19 | 4.86 |

In each of luminescent materials of Examples 8 and 9, p in compositional formula 1 is in a range of 0.008 to 0.114 inclusive as shown Table 11 above. In Comparative Examples 3 and 4, no Ca is contained (p=0).

Peak wavelengths, luminescence properties and temperature properties are determined in the same manner as described above for luminescent materials of Examples 8 and 9 and Comparative Examples 3 and 4, and the results are summarized in Table 12 below.

TABLE 12

|  | Peak wavelength | Luminous efficiency | Temperature property |
|---|---|---|---|
| Example 8(R8) | 632 nm | 100% | 100% |
| Example 9(R9) | 626 nm | 97% | 99% |
| Comparative Example 3(H3) | 632 nm | 100% | 100% |
| Comparative Example 4(H4) | 630 nm | 100% | 100% |

It is shown in Table 12 above that luminescent materials of Comparative Examples 3 and 4 have a luminous efficiency and a temperature property comparable to those of Examples 8 and 9. However, in luminescent materials of Comparative Examples 3 and 4 having no Ca, a decrease in luminous intensity cannot be suppressed when the temperature rises. This will be described later.

Comparative Example 5

$Sr_3N_2$, $Mg_3N_2$, EuN, $Si_3N_4$, $Al_2O_3$ and AlN were prepared as starting materials and each weighed in a vacuum glove box. The blending amounts of $Sr_3N_2$, $Mg_3N_2$, EuN, $Si_3N_4$, $Al_2O_3$ and AlN were 2.765 g, 0.020 g, 0.149 g, 4.911 g, 0.510 g and 1.435 g, respectively. The weighed raw material powders were mixed in a dry process by a planetary ball mill. The obtained mixture was filled in a boron nitride (BN) crucible, and heated at 1850° C. for 0.5 hours in a $N_2$ atmosphere at 7.5 atm. Further, for obtaining a single-phase red-emitting luminescent material, classification was performed by dry sieving using several sieves having different apertures.

A luminescent material (H5) of this Comparative Example was thus obtained. The design composition of the luminescent material (H5) is $[(Sr_{0.98}Ca_{0.02})_{0.97}Eu_{0.03}]_2 Si_7 Al_3 ON_{13}$.

The obtained luminescent material (H5) was a powder, the body color of which was orange, and when it was excited with black light, a red luminescence was observed. A luminescence emission spectrum obtained by exciting the red-emitting luminescent material (H5) by radiating light having a peak wavelength of 450 nm using a light-emitting element same as that described above is shown in FIG. 31. As shown in the figure, a peak of luminescence is present in a wavelength range of 570 to 670 nm, but the luminous efficiency thereof is only about 83% in terms of a ratio to that of Comparative Example 1. This is thought to be because there exists a factor of hindering emission due to the presence of Mg.

An XRD pattern of the luminescent material of Comparative Example 5 is shown in FIG. 32. The XRD pattern was determined in the same manner as described above. As shown in the pattern of FIG. 32, the peak position shows a crystal structure of $Sr_2Si_7Al_3ON_{13}$, but heterophases are generated by increasing the blending amount of $Mg_3N_2$, and the heterophases increase in proportion to the blending amount.

In the XRD pattern of FIG. 32, ten peaks of higher intensities were selected, and designated as main peaks, and positions (2θ) thereof were marked with "○" in Table 13 below.

TABLE 13

| 2θ(°) | H5 |
|---|---|
| 15.1 ± 0.1 | ○ |
| 23.0 ± 0.1 |  |
| 24.9 ± 0.15 | ○ |
| 25.7 ± 0.2 |  |
| 26.0 ± 0.15 |  |
| 29.4 ± 0.1 | ○ |
| 31.0 ± 0.1 | ○ |
| 31.7 ± 0.15 | ○ |
| 33.1 ± 0.15 |  |
| 33.6 ± 0.15 |  |
| 34.0 ± 0.15 | ○ |
| 34.4 ± 0.2 |  |
| 35.2 ± 0.25 | ○ |
| 36.1 ± 0.1 | ○ |
| 36.6 ± 0.15 | ○ |
| 37.3 ± 0.2 |  |
| 40.6 ± 0.2 |  |
| 56.6 ± 0.25 | ○ |

As shown in Table 13 above, it is apparent that the luminescent material (H5) has a crystal structure of $Sr_2Si_7Al_3ON_{13}$ because ten main peaks are present at predetermined positions.

Results of chemical analyses performed by ICP for the luminescent material of Comparative Example 5 are summarized in Table 14 below. Values shown in Table 14 are molar ratios normalized by the Al amount.

TABLE 14

|  | Sr | Mg | Eu | Si | Al | O | N |
|---|---|---|---|---|---|---|---|
| Comparative Example 5(H5) | 0.68 | 0.009 | 0.022 | 2.45 | 1 | 0.45 | 4.45 |

Composition parameters in compositional formula $[(Sr_{1-p1}Mg_{p1})_{1-x}Eu_x]_4Si_BAlO_CN_D$ are calculated based on values shown in Table 14 above, and summarized in Table 15 below.

As shown in Table 15 above, the luminescent material of Comparative Example 5 has a composition equivalent to the above compositional formula 1 except that Ca is changed to Mg.

TABLE 15

| | $[(Sr_{1-p1}Mg_{p1})_{1-x}Eu_x]_4Si_BAlO_CN_D$ | | | | | |
|---|---|---|---|---|---|---|
| | p1 | x | A | B | C | D |
| Comparative Example 5(H5) | 0.013 | 0.031 | 0.65 | 2.45 | 0.45 | 4.45 |

The peak wavelength, luminous efficiency and temperature property are determined in the same manner as described above, and the results are summarized in Table 16 below.

TABLE 16

|  | Peak wavelength | Luminous efficiency | Temperature property |
|---|---|---|---|
| Comparative Example 5(H5) | 599 nm | 83% | 100% |

In the luminescent material of Comparative Example 5, not Ca but Mg is contained, and thus the luminous efficiency is only 83%. This value is even inferior to that of Comparative Example 1 containing no Ca, and it is apparent that Mg has a negative effect.

Excitation spectra measured by a fluorescence spectrophotometer FluoroMax-4 (manufactured by HORIBA, Ltd.) for luminescent materials of Examples 3 to 7 and Comparative Example 1 are shown in FIGS. 33 to 43. In each spectrum, the intensity of the excitation spectrum is normalized by an intensity at a wavelength presumed as a peak wavelength at initial driving ($\lambda_0$), and shown. The wavelength range and the wavelength presumed as a peak wavelength at initial driving ($\lambda_0$) in each figure are summarized in Table 17 below.

TABLE 17

Figure 34:
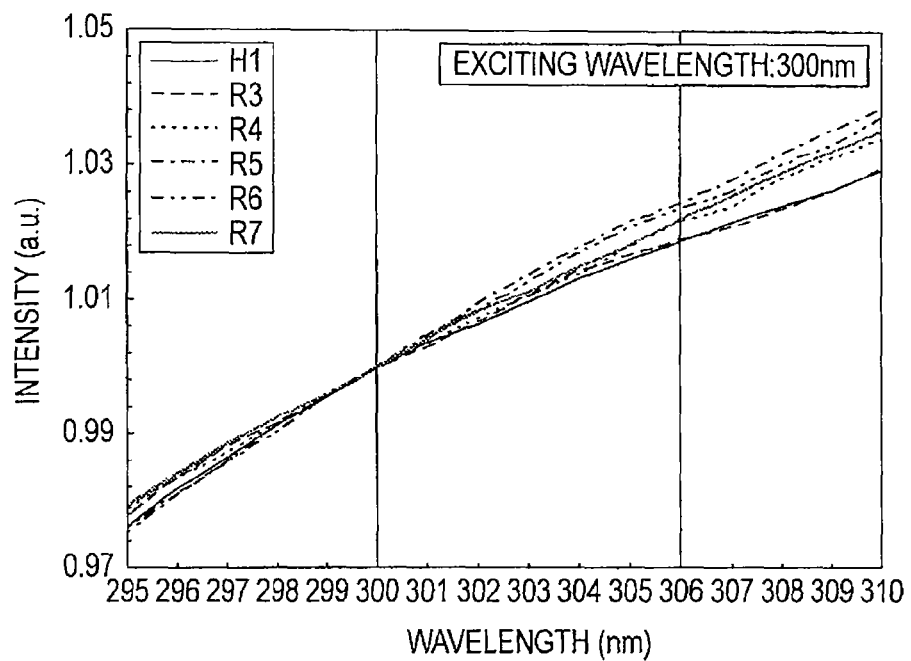
FIG. 34 is normalized excitation spectra of luminescent materials of Example and Comparative Example.
Figure 35:
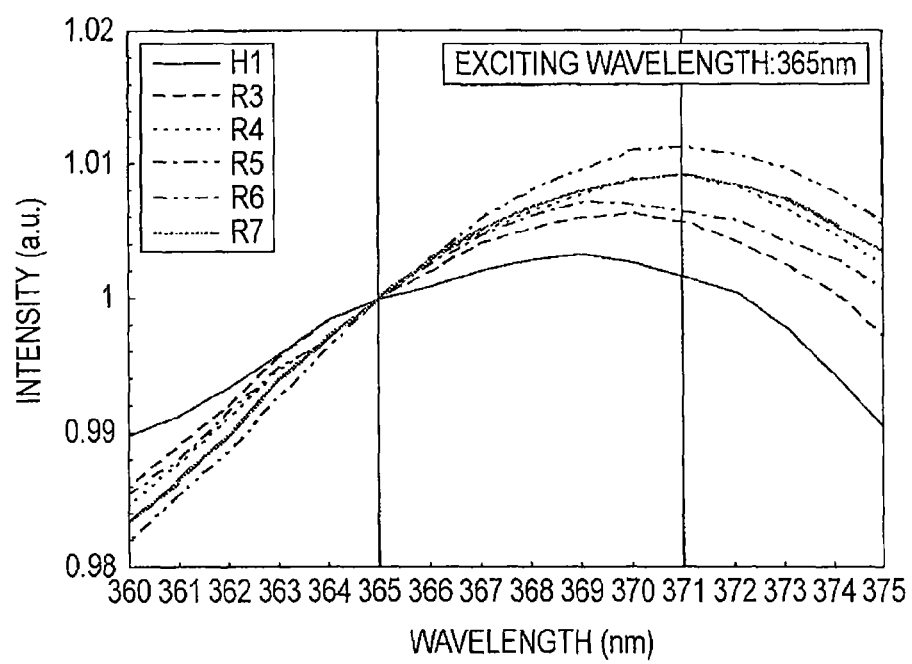
FIG. 35 is normalized excitation spectra of luminescent materials of Example and Comparative Example.
Figure 38:
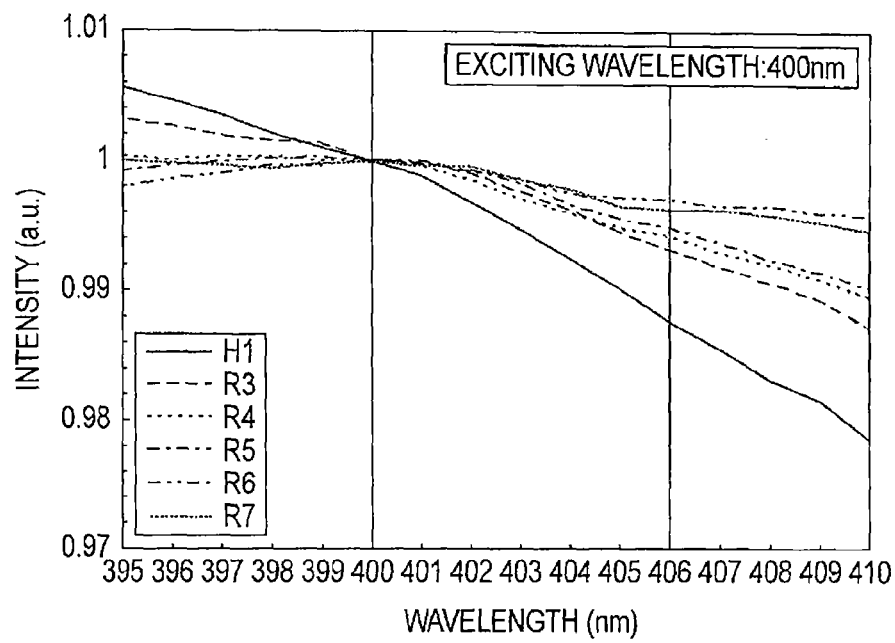
FIG. 38 is normalized excitation spectra of luminescent materials of Example and Comparative Example.
Figure 39:
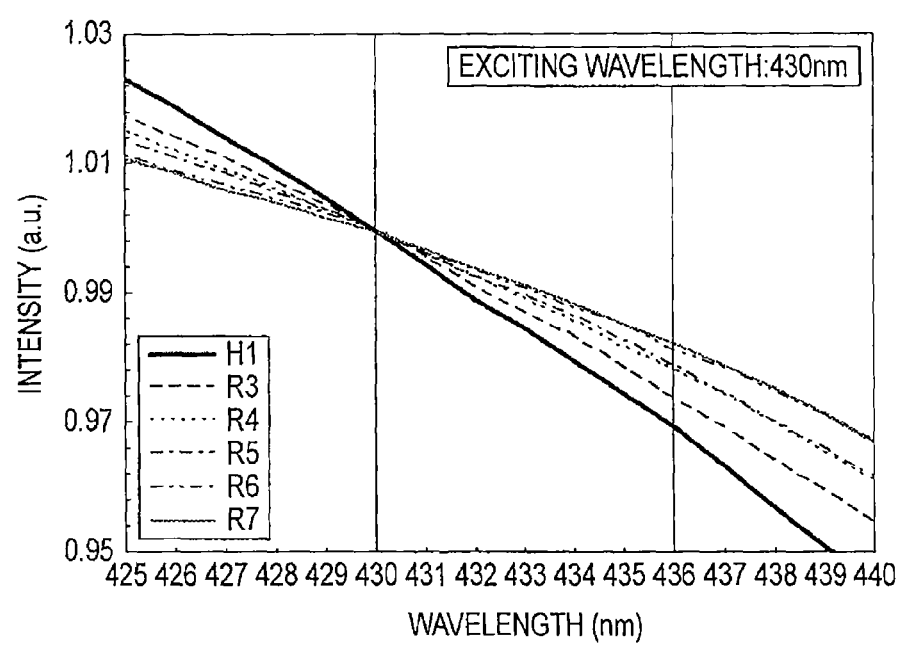
FIG. 39 is normalized excitation spectra of luminescent materials of Example and Comparative Example.
Figure 42:
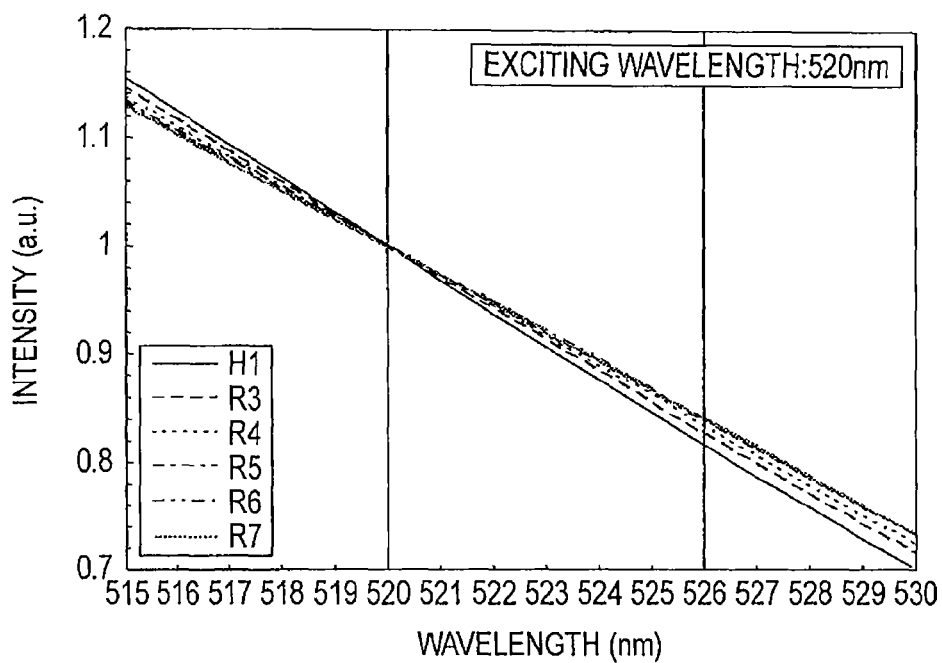
FIG. 42 is normalized excitation spectra of luminescent materials of Example and Comparative Example.
Figure 43:
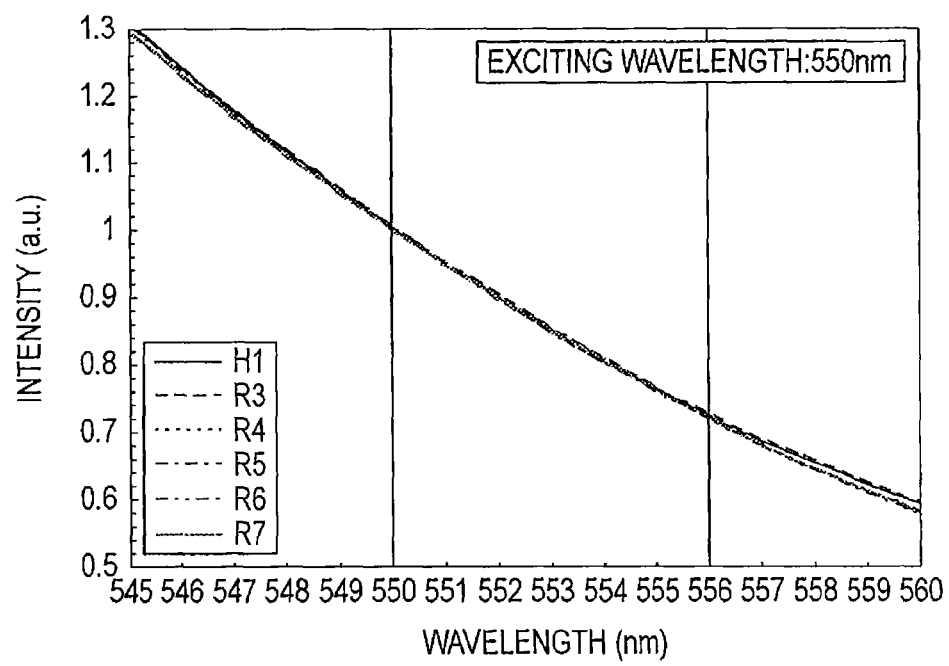
FIG. 43 is normalized excitation spectra of luminescent materials of Example and Comparative Example.

|  | | LED peak wavelength | |
|---|---|---|---|
| | Wavelength range | At initial driving ($\lambda_0$) | At steady-state driving ($\lambda_1$) |
| FIG. 33 | 245~260 nm | 250 nm | 256 nm |
| FIG. 34 | 295~310 nm | 300 nm | 306 nm |
| FIG. 35 | 360~375 nm | 365 nm | 371 nm |
| FIG. 36 | 375~390 nm | 380 nm | 386 nm |
| FIG. 37 | 385~400 nm | 390 nm | 396 nm |
| FIG. 38 | 395~410 nm | 400 nm | 406 nm |
| FIG. 39 | 425~440 nm | 430 nm | 436 nm |
| FIG. 40 | 445~460 nm | 450 nm | 456 nm |
| FIG. 41 | 475~490 nm | 480 nm | 486 nm |
| FIG. 42 | 515~530 nm | 520 nm | 526 nm |
| FIG. 43 | 545~560 nm | 550 nm | 556 nm |

Table 17 above also shows each peak wavelength of light emitted by a LED at steady-state driving ($\lambda_1$). The peak wavelength at steady-state driving ($\lambda_1$) was determined on the presumption that it is extended by 6 nm from the peak wavelength at initial driving ($\lambda_0$).

The intensity ($I_{ex}$) at steady-state driving for luminescent materials of Examples was determined based on the intensity ($I_{ref}$) of the luminescent material of Comparative Example at steady-state driving (peak wavelength: $\lambda_1$). The intensity of the luminescent material of Comparative Example 1 at steady-state driving (peak wavelength: $\lambda_1$) and the intensity at steady-state driving for luminescent materials of Examples 3 to 7 are read from FIGS. 33 to 43.

With the intensity of the luminescent material of Comparative Example 1 defined as $I_{ref}$ and the intensity of each of luminescent materials of Examples 3 to 7 defined as I, an intensity difference ($I-I_{ref}$) is determined for each luminescent material, and summarized in Table 18 below. If the intensity difference ($I-I_{ref}$) is a positive value, it can be determined that a decrease in luminous intensity at steady-state driving is suppressed. The higher the luminous intensity at steady-state driving is as compared to that at initial driving, the more advantageous because a decrease in luminous intensity of the luminescent material associated with temperature quenching can be cancelled.

TABLE 18

| LED peak wavelength at | | $I - I_{ref}$ | | | |
|---|---|---|---|---|---|
| initial driving | R3 | R4 | R5 | R6 | R7 |
| 250 nm | 0.49 | 1.13 | 0.22 | 1.89 | 1.31 |
| 300 nm | 0.02 | 0.29 | 0.57 | 0.48 | 0.35 |
| 365 nm | 0.40 | 0.75 | 0.48 | 0.96 | 0.78 |
| 380 nm | 0.30 | 0.12 | 0.06 | 0.22 | 0.15 |
| 390 nm | 0.42 | 0.48 | 0.59 | 0.75 | 0.63 |
| 400 nm | 0.54 | 0.66 | 0.72 | 0.93 | 0.86 |
| 430 nm | 0.43 | 0.86 | 0.91 | 1.18 | 1.32 |
| 450 nm | 0.46 | 1.07 | 1.17 | 1.24 | 1.29 |
| 480 nm | 0.68 | 1.34 | 1.50 | 1.95 | 2.00 |
| 520 nm | 1.05 | 1.76 | 2.28 | 2.32 | 2.59 |
| 550 nm | 0.46 | −0.52 | −0.48 | −0.29 | 0.01 |

Further, for luminescent materials (R1, R2, H2 and H5) of Examples 1 and 2 and Comparative Examples 2 and 5, an excitation spectrum in a predetermined wavelength range was obtained, and normalized by an intensity at a wavelength presumed as a peak wavelength at initial driving ($\lambda_0$), and an intensity at steady-state driving (peak wavelength: $\lambda_1$) was read in the same manner as described above.

With the intensity of the luminescent material of Comparative Example 1 at steady-state driving (peak wavelength: $\lambda_1$) defined as $I_{ref}$ and the intensity of each of luminescent materials of Examples 1 and 2 and Comparative Examples 2 and 5 defined as I, an intensity difference ($I-I_{ref}$) is determined for each luminescent material in the same manner as described above, and summarized in Table 19 below.

TABLE 19

| LED peak wavelength at | | $I - I_{ref}$ | | |
|---|---|---|---|---|
| initial driving | R1 | R2 | H2 | H5 |
| 250 nm | 0.31 | 1.41 | −8.02 | 2.32 |
| 300 nm | 0.47 | 0.55 | −1.41 | 0.40 |
| 365 nm | 0.18 | −0.06 | 1.13 | 0.27 |
| 380 nm | −0.02 | −0.07 | 0.17 | 0.55 |
| 390 nm | −0.06 | −0.14 | 0.28 | 0.31 |
| 400 nm | 0.36 | 0.09 | 0.20 | 0.23 |

TABLE 19-continued

| LED peak wavelength at initial driving | I − I$_{ref}$ | | | |
|---|---|---|---|---|
| | R1 | R2 | H2 | H5 |
| 430 nm | 0.20 | 0.16 | −0.46 | −0.20 |
| 450 nm | 0.11 | 0.32 | −0.50 | −0.55 |
| 480 nm | 0.20 | 0.33 | −0.06 | −1.15 |
| 520 nm | −0.02 | 0.29 | 3.33 | −2.23 |
| 550 nm | 0.02 | 0.45 | 6.35 | −0.28 |

As shown in Tables 18 and 19 above, luminescent materials (R1 to R7) of Examples 1 to 7 have a lower decrease in luminous intensity as compared to the luminescent material (H1) of Comparative Example 1 in most cases even though the peak wavelength of LED light is extended by 6 nm in a wavelength range of 250 to 520 nm. Since luminescent materials (R1 to R7) of Examples 1 to 7 all contain Sr and Ca so as to satisfy a predetermined quantitative relationship, this effect could be obtained.

It is shown in the result for the luminescent material (H2) of Comparative Example 2 that if the amount of Ca is excessive, the effect of suppressing a decrease in luminous intensity at steady-state driving cannot be obtained. Moreover, in the luminescent material (H2) of Comparative Example 2, the peak wavelength of luminescence changes, and also the luminous efficiency decreases as described with reference to the luminescence emission spectrum of FIG. 13. As shown in the XRD pattern of FIG. 22, excessive Ca causes generation of heterphases to degrade properties of the luminescent material.

If Mg is used in place of Ca, an intended effect cannot be obtained even though Mg is contained so as to satisfy a predetermined quantitative relationship as shown in the result for the luminescent material (H5) of Comparative example 5. The luminescent material (H5) of Comparative Example 5 has a low luminous efficiency and is inferior to the luminescent material (H1) of Comparative Example 1 containing no Ca. In the XRD pattern of FIG. 32, no heterophase is present, the amount of heterophases increases as the content of Mg increases.

For luminescent materials (R8, R9, H3 and H4) of Examples 8 and 9 and Comparative Examples 3 and 4, an excitation spectrum in a predetermined wavelength range was obtained, and normalized by an intensity at a wavelength presumed as a peak wavelength at initial driving ($\lambda_0$), and an intensity at steady-state driving (peak wavelength: $\lambda_1$) was read in the same manner as described above.

Specifically, with the intensity of the luminescent material of Comparative Example 3 at steady-state driving (peak wavelength: $\lambda_1$) defined as I$_{ref}$ and the intensity of the luminescent material of Example 8 defined as I, (I−I$_{ref}$) for Example 8 (R8) was determined, and with the intensity of the luminescent material of Comparative Example 4 at steady-state driving (peak wavelength: $\lambda_1$) defined as I$_{ref}$ and the intensity of the luminescent material of Example 9 defined as I, (I−I$_{ref}$) for Example 9 (R9) was determined. The results are summarized in Table 20 below.

TABLE 20

| LED peak wavelength at initial driving | I − I$_{ref}$ | |
|---|---|---|
| | R8 | R9 |
| 250 nm | 1.83 | 2.88 |

TABLE 20-continued

| LED peak wavelength at initial driving | I − I$_{ref}$ | |
|---|---|---|
| | R8 | R9 |
| 300 nm | 0.32 | 0.21 |
| 365 nm | 0.33 | 0.41 |
| 380 nm | 0.14 | −0.02 |
| 390 nm | −0.11 | −0.03 |
| 400 nm | 0.33 | 0.12 |
| 430 nm | −0.01 | 0.62 |
| 450 nm | 0.08 | 0.77 |
| 480 nm | 0.18 | 0.69 |
| 520 nm | 0.75 | 1.00 |
| 550 nm | 0.53 | 0.09 |

As shown in Table 20 above, luminescent materials (R8 and R9) of Examples 8 and 9 have a lower decrease in luminous intensity as compared to luminescent materials (H3 and H4) of Comparative Examples 3 and 4 in most cases even though the peak wavelength of LED light is extended by 6 nm in a wavelength range of 250 to 520 nm. Since luminescent materials (R8 and R9) of Examples 8 and 9 both contain Sr and Ca so as to satisfy a predetermined quantitative relationship, this effect could be obtained.

According to an embodiment of the present invention, a red-emitting luminescent material having a high quantum efficiency and a high luminous intensity is provided. The red-emitting luminescent material has a low decrease in luminous intensity even when the temperature rises, and has a low decrease in luminous intensity by a shift in excitation wavelength at driving of a LED. In addition, according to an embodiment of the present invention, a light-emitting device having a small color shift even at driving under a high load is provided. This light-emitting device has extremely high practical performance because the color shift, i.e. color change at driving, is small.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
   a light-emitting element which emits light having an emission peak in a wavelength range of 380 to 490 nm, the element having a peak wavelength in steady-state driving shifted by 6 nm or more toward longer wavelength as compared to a peak wavelength at initial driving; and
   a luminous layer comprising a red-emitting luminescent material which receives light from the light-emitting element to emit red light, the red-emitting luminescent material having a composition represented by formula 1:

$$[(Sr_{1-p}Ca_p)_{1-x}Eu_x]_4Si_BAlO_CN_D \qquad \text{formula 1}$$

wherein p, x, A, B, C and D satisfy following conditions:

$0.008 \leq p \leq 0.114, 0 < x \leq 0.4, 0.55 \leq A \leq 0.8,$ $2 \leq B \leq 3, 0 < C \leq 0.6, 4 \leq D \leq 5,$ the luminous layer further comprising a green-emitting luminescent material which receives light from the light-emitting element to emit green light.

2. The light-emitting device according to claim 1, wherein the green-emitting luminescent material is β sialon:Eu.

3. The light emitting device of claim 1, wherein:
p is 0.025≤p≤0.114
x is 0.031≤x≤0.036
A is 0.61≤A≤0.68
B is 2.28≤B≤2.62
C is 0.16≤C≤0.43 and
D is 4.08≤D≤4.64.

4. The light-emitting device according to claim 1, wherein the red-emitting luminescent material has an orthorhombic crystal structure.

5. A light-emitting device comprising:
a light-emitting element which emits light having an emission peak in a wavelength range of 380 to 490 nm, the element having a peak wavelength in steady-state driving shifted by 6 nm or more toward longer wavelength as compared to a peak wavelength at initial driving; and
a luminous layer comprising a red-emitting luminescent material which receives light from the light-emitting element to emit red light, the red-emitting luminescent material having a composition represented by formula 1:

$[(Sr_{1-p}Ca_p)_{1-x}Eu_x]_4Si_BAlO_CN_D$  formula 1 wherein p, x, A, B, C and D satisfy following conditions:

0.008≤p≤0.114, 0<x≤0.4, 0.55≤A≤0.8,

2≤B≤3, 0<C≤0.6, 4≤D≤5, the luminous layer further comprising a yellow-emitting luminescent material which receives light from the light-emitting element to emit yellow light.

6. The light-emitting device according to claim 5, wherein the yellow-emitting luminescent material is $Y_3Al_5O_{12}$:Ce.

7. The light emitting device of claim 5, wherein:
p is 0.025≤p≤0.114
x is 0.031≤x≤0.036
A is 0.61≤A≤0.68
B is 2.28≤B≤2.62
C is 0.16≤C≤0.43 and
D is 4.08≤D≤4.64.

8. The light-emitting device according to claim 5, wherein the red-emitting luminescent material has an orthorhombic crystal structure.

9. A light-emitting device comprising:
a light-emitting element which emits light having an emission peak in a wavelength range of 250 to 430 nm, the element having a peak wavelength in steady-state driving shifted by 6 nm or more toward longer wavelength as compared to a peak wavelength at initial driving; and
a luminous layer comprising a red-emitting luminescent material which receives light from the light-emitting element to emit red light, the red-emitting luminescent material having a composition represented by formula 1:

$[(Sr_{1-p}Ca_p)_{1-x}Eu_x]_4Si_BAlO_CN_D$  formula 1 wherein p, x, A, B, C and D satisfy following conditions:

0.008≤p≤0.114, 0<x≤0.4, 0.55≤A≤0.8,

2≤B≤3, 0<C≤0.6, 4≤D≤5, the luminous layer further comprising a green-emitting luminescent material which receives light from the light-emitting element to emit green light and a blue-emitting luminescent material which receives light from the light-emitting element to emit blue light.

10. The light-emitting device according to claim 9, wherein the green-emitting luminescent material is β sialon:Eu.

11. The light-emitting device according to claim 9, wherein the blue-emitting luminescent material is $BaMgAl_{10}O_{17}$:Eu.

12. The light-emitting device according to claim 10, wherein the blue-emitting luminescent material is $BaMgAl_{10}O_{17}$:Eu.

13. The light emitting device of claim 9, wherein:
p is 0.025≤p≤0.114
x is 0.031≤x≤0.036
A is 0.61≤A≤0.68
B is 2.28≤B≤2.62
C is 0.16≤C≤0.43 and
D is 4.08≤D≤4.64.

14. The light-emitting device according to claim 9, wherein the red-emitting luminescent material has an orthorhombic crystal structure.

* * * * *